United States Patent
Deno et al.

(10) Patent No.: US 9,217,070 B2
(45) Date of Patent: Dec. 22, 2015

(54) BLACK COLORANT MIXTURE

(71) Applicant: BASF SE, Ludwigshafen (DE)

(72) Inventors: Takashi Deno, Nishinomiya (JP); Mamiko Takesue, Osaka (JP); Jan Sültemeyer, Village Neuf (FR)

(73) Assignee: BASF SE, Ludwigshafen (DE)

(*) Notice: Subject to any disclaimer, the term of this patent is extended or adjusted under 35 U.S.C. 154(b) by 0 days.

(21) Appl. No.: 14/404,033

(22) PCT Filed: May 29, 2013

(86) PCT No.: PCT/IB2013/054432
§ 371 (c)(1),
(2) Date: Nov. 26, 2014

(87) PCT Pub. No.: WO2013/179237
PCT Pub. Date: Dec. 5, 2013

(65) Prior Publication Data
US 2015/0183955 A1  Jul. 2, 2015

Related U.S. Application Data

(60) Provisional application No. 61/654,105, filed on Jun. 1, 2012.

(30) Foreign Application Priority Data

Jun. 1, 2012  (EP) ..................... 12170397

(51) Int. Cl.
*G02B 5/20*  (2006.01)
*G03F 7/033*  (2006.01)
(Continued)

(52) U.S. Cl.
CPC ............ *C08K 5/3417* (2013.01); *C08K 5/3442* (2013.01); *C09B 67/0033* (2013.01);
(Continued)

(58) Field of Classification Search
CPC .... C08K 5/3417; C08K 5/3442; G03F 7/033; G03F 7/0007; G03F 7/027; G03F 7/105; G02B 5/20; G02B 5/223; G02F 1/133512; G02F 1/1339; G02F 2011/13398; C09B 67/0033
USPC .............................................. 430/7
See application file for complete search history.

(56) References Cited

U.S. PATENT DOCUMENTS 5,626,796 A  5/1997  Tsujimura et al.
5,650,263 A  7/1997  Wakata et al.
(Continued)

FOREIGN PATENT DOCUMENTS

CH    373844 A   12/1963
EP    0485337 A1  5/1992
(Continued)

OTHER PUBLICATIONS

Computer-generated translation of JP 2006-235153 (Sep. 2006).*
(Continued)

*Primary Examiner* — John A McPherson
(74) *Attorney, Agent, or Firm* — Drinker Biddle & Reath LLP

(57) ABSTRACT

A black colorant mixture comprising a bis-oxodihydro-indolylene-benzodifuranone colorant and a perylene colorant is disclosed which provides high blackness and NIR transparency combined with low conductivity for organic coating films used in display devices. Especially, a black matrix for color filter applications and black column spacers are described used in LCD devices. Further, the black colorant mixture can be used in bezels of a display device equipped with a touch sensor.

18 Claims, 1 Drawing Sheet

(51) Int. Cl.
  *C08K 5/3417*    (2006.01)
  *G03F 7/00*      (2006.01)
  *G03F 7/027*     (2006.01)
  *G03F 7/105*     (2006.01)
  *C09B 67/22*     (2006.01)
  *C08K 5/3442*    (2006.01)
  *G02F 1/1335*    (2006.01)
  *G02F 1/1339*    (2006.01)

(52) U.S. Cl.
  CPC ............... *G02B 5/20* (2013.01); *G02F 1/1339* (2013.01); *G02F 1/133512* (2013.01); *G03F 7/0007* (2013.01); *G03F 7/027* (2013.01); *G03F 7/033* (2013.01); *G03F 7/105* (2013.01); *G02F 2001/13398* (2013.01)

(56) References Cited

U.S. PATENT DOCUMENTS

| | | | |
|---|---|---|---|
| 2003/0121113 | A1 | 7/2003 | Nesvadba et al. |
| 2003/0172847 | A1 | 9/2003 | He et al. |
| 2004/0215015 | A1 | 10/2004 | Nazarov et al. |
| 2005/0016420 | A1* | 1/2005 | Mizuguchi et al. ........... 106/493 |
| 2006/0166113 | A1 | 7/2006 | Lee et al. |
| 2007/0151478 | A1 | 7/2007 | Erk et al. |
| 2009/0292039 | A1 | 11/2009 | Sawamoto et al. |
| 2010/0243970 | A1 | 9/2010 | Toshimitsu et al. |
| 2012/0172498 | A1* | 7/2012 | Fontana et al. ................. 524/94 |

FOREIGN PATENT DOCUMENTS

| | | | |
|---|---|---|---|
| EP | 1095313 | A1 | 5/2001 |
| GB | 972485 | A | 10/1964 |
| GB | 2305765 | A | 4/1997 |
| JP | 2004168963 | A | 6/2004 |
| JP | 2006-235153 | A * | 9/2006 |
| JP | 2008151967 | A | 7/2008 |
| JP | 2010015025 | A | 1/2010 |
| JP | 2010049238 | A | 3/2010 |
| WO | WO-0024736 | A1 | 5/2000 |
| WO | WO-0210288 | A1 | 2/2002 |
| WO | WO-2005030878 | A1 | 4/2005 |
| WO | WO-2005080337 | A1 | 9/2005 |
| WO | WO-2006018405 | A1 | 2/2006 |
| WO | WO-2006037728 | A1 | 4/2006 |
| WO | WO-2007062963 | A1 | 6/2007 |
| WO | WO-2007071497 | A1 | 6/2007 |
| WO | WO-2007071797 | A1 | 6/2007 |
| WO | WO-2007113107 | A1 | 10/2007 |
| WO | WO-2008078678 | A1 | 7/2008 |
| WO | WO-2008101841 | A1 | 8/2008 |
| WO | WO-2009010521 | A2 | 1/2009 |
| WO | WO-2009019173 | A1 | 2/2009 |
| WO | WO-2009144115 | A1 | 12/2009 |
| WO | WO-2010081624 | A1 | 7/2010 |
| WO | WO-2011138287 | A1 | 11/2011 |
| WO | WO-2011152066 | A1 | 12/2011 |
| WO | WO-2012051264 | A1 | 4/2012 |
| WO | WO-2013008176 | A1 | 1/2013 |

OTHER PUBLICATIONS

International Search Report for PCT/IB2013/054432 mailed Oct. 31, 2013.

* cited by examiner

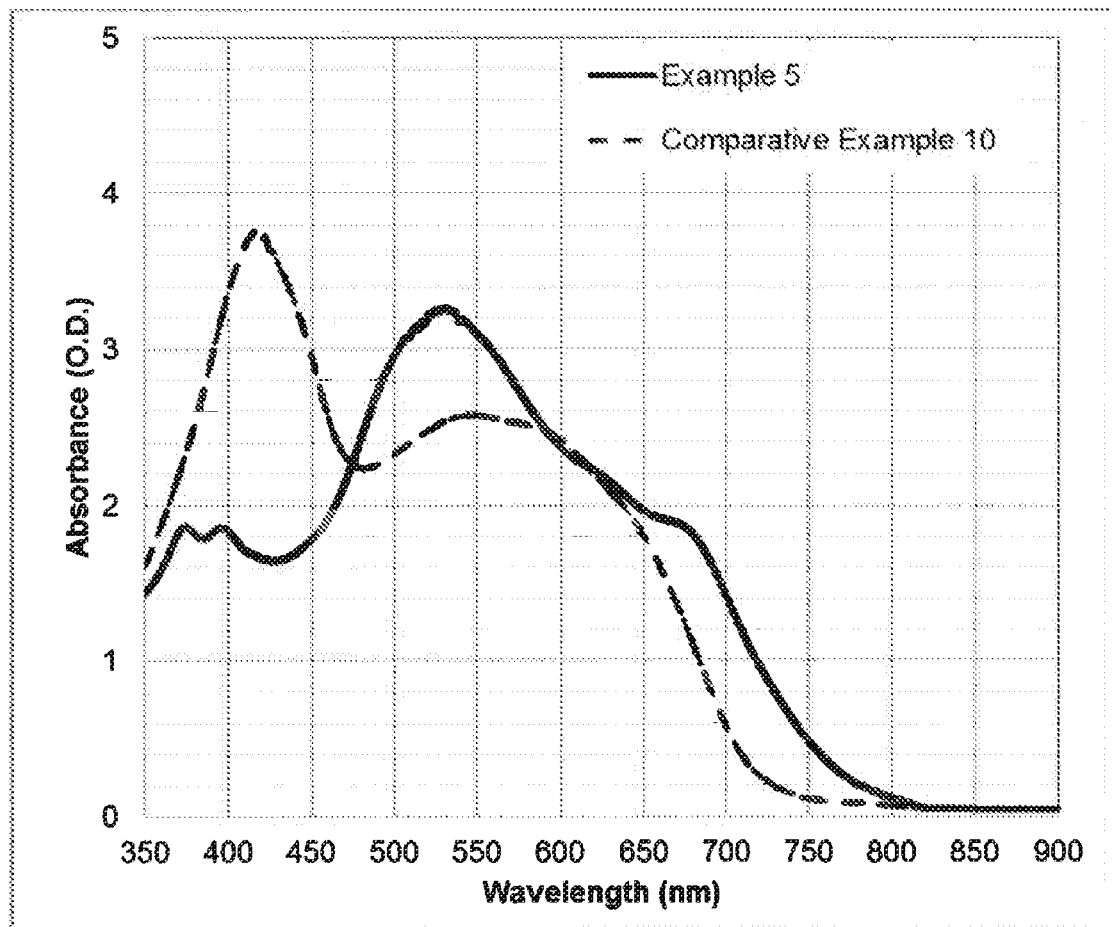

BLACK COLORANT MIXTURE

CROSS-REFERENCE TO RELATED APPLICATIONS

This application is a national stage application (under 35 U.S.C. §371) of PCT/IB2013/054432, filed May 29, 2013, which claims benefit of U.S. Application No. 61/654,105, filed Jun. 1, 2012, and European Application No. 12170397.9, filed Jun. 1, 2012, all of which are incorporated herein by reference in their entirety.

The present invention relates to a colorant mixture comprising a bis-oxodihydro-indolylene-benzodifuranone colorant and a perylene colorant, to the use of said colorant mixture in manufacturing a black matrix for a color filter, a black column spacer for a liquid crystal display (LCD) device or a black bezel of a display device, to a composition comprising said colorant composition, especially a photosensitive resist formulation for making a black matrix for a color filter or a black column spacer for a LCD device, to a black matrix and column spacer comprising a cured layer of said formulation. The invention further relates to a display device equipped with a touch sensor comprising a bezel containing said colorant mixture.

In the LCD industry there are high demands to lower power consumption and to reduce production costs. One of the possible solutions to lower power consumption is to narrow the line width of the black matrix surrounding RGB color pixels which increases an aperture ratio of color filters resulting in improving brightness and in lowering power consumption. A conventional LCD is composed of two glass substrates, one with pixels and the other with a TFT array assembled with a distance of several μm (cell gap of liquid crystal), and it requires a relatively wider black matrix as an alignment merging the two substrates. Therefore, there is a limit for the line width of the black matrix. As an alternative, so-called "Color filters on Array" (CoA) architecture, i.e. pixels and black matrix are formed onto a TFT array, has been extensively investigated in the LCD industry which enables a more narrow black matrix to improve the aperture ratio. The CoA architecture is additionally expected to improve the overall productivity of a LCD since complicated manufacturing processes, i.e. fabrication of a TFT array, pixels and black matrix, are on the same substrate and not necessary to pay attention to a well-balanced production of the two substrates (TFT and CF) of a conventional architecture. For this CoA architecture, it is necessary to use a black colorant with very low conductivity in the black matrix in order to avoid malfunction of the TFT array due to a conductive black colorant.

Another demand in the LCD industry is to improve the image quality, for example, a higher contrast ratio. The contrast ratio is essentially determined by the quality of polarizers, color filters and alignment degree of a liquid crystal, but other components of the LCD also affect the contrast ratio. For example, currently a transparent column spacer has been widely used in the LCD technology to maintain a proper gap of the liquid crystal cell but the transparent spacer disturbs polarized light reducing the contrast ratio. One of a possible solution is to mix with a black colorant not to scatter but to absorb the polarized light, i.e. a black column spacer. The black colorant for this purpose is required to have a very low electric conductivity as it is formed in the liquid crystal cell under an electric field for LC operation. Further, said black colorant is also required to have a relatively high transmission in the ultra violet (UV) region for a black column spacer of a thickness of several μm by a photolithography method.

Such a low conductive black colorant is also demanded for LCD with an in-cell touch panel. Furthermore, the low conductive black colorant is highly demanded in the display industry, not only for LCD but also for organic LED and e-paper displays and for a black bezel equipped with electrical touch sensors.

Black colorants for the above-mentioned applications are therefore required to be small particles with a uniform size distribution and good rheology to minimize scattering the light, to exhibit a neutrally black color and wide spectrum coverage with relatively less absorption in the UV region for photolithography, and to be very low in electric conductivity.

The most widely used black colorant in the LCD industry has been carbon black (Color Index (C.I.) Pigment Black 7). Carbon black is inexpensive and has excellent performance characteristics such as high optical density, i.e. blackness, and durability, but also serious disadvantages such as problematic dispersibility of very fine particles, high absorption in the UV region for photolithography and, as its nature, high electric conductivity.

Various approaches have been proposed to reduce the electric conductivity of carbon black.

JP-A-2004/168963 discloses a carbon black pigment modified by wet oxidation, the conductivity of which is said to be very low. However, actinic curing even of layers of just ~1 μm thickness requires high irradiation and a long post-cure at high temperature, meaning that productivity is not fully satisfactory.

US-A-2006/0166113 proposes inorganic black pigments, particularly mixed metal oxides (MMOs), wherein it is essential that two fractions of differing granulometry be combined with each other (a first, fine fraction having an average particle size of 5-50 nm and a second, coarse fraction having an average particle size from 0.5-5.0 μm). However, these compositions do not satisfactorily meet the above-mentioned requirements. Moreover, mixed metal oxides contain heavy metals not generally recognized as safe for humans and the environment.

These approaches to make non-conductive black matrix from carbon black or other inorganic black colorants have been failed, therefore, use of organic pigment(s) have been widely examined since organic pigments are, as their nature, very low conductive.

GB-A-2305765 proposes replacing conventional chrome black by graphite, carbon black or a mixture of red, green and blue pigments. However, graphite and carbon black are electrically conductive, and no concrete examples of a mixture of red, green or blue pigments are disclosed.

US-A-2010/0243970 discloses a resin black matrix comprising at least three, preferably five organic colored pigments selected from red, blue, green, yellow, violet and orange pigments. Said black matrix fulfills some of the key requirements such as good spectrum coverage in the visible region, good pattern profile and low conductivity, but such a multiple pigment combination does not give a sufficiently high optical density because absorption intensities of pigments are diluted by each other.

Organic black pigments have also been proposed, for example perylene black, such as C.I. Pigment Black 32. However, such previously known organic black pigments have the disadvantage of possessing unsatisfactory jetness, particularly after high thermal stress.

WO-A-20121051264 discloses a black matrix using a mixture of surface modified C.I. Pigment Black 32 and a polyoxyalkylene polymer modified carbon black. In order to obtain a sufficient optical density a higher amount of the modified carbon black is required, which adversely affects the requirement of low conductivity.

WO-A-00/24736 discloses the preparation of a bis-oxodihydroindolylene-benzodifuranone compound as a violet powder in a highly aggregated form.

WO-A-2005/030878 discloses a IR-reflective black pigment composition comprising a halogenated copper phthalocyanine such as C.I. Pigment Green 7 and a perylene tetracarboxylic acid diimide such as CA. Pigment Violet 29 which are suitable for coloring coatings and inks.

Finally, WO-A-2010/081624 discloses a new class of organic black bis-oxodihydro-indolylene-benzodifuranone pigments for black matrix applications. This pigment fulfills key requirements such as good optical density, good pattern profile and good process durability and, hence, is applicable to, e.g., non-conductive black matrix applications. However, there is still a need to further improve the performance of a black matrix, especially the optical density.

It is an object of the present invention to provide a colorant mixture imparting high optical density combined with high NIR transparency and low conductivity to elements used in display devices.

A further object is to provide a black matrix for a color filter having improved blackness, especially in a LCD device, and a black column spacer for a LCD device.

It has been found that the optical density of a black matrix comprising a bis-oxodihydro-indolylene-benzodifuranone pigment can be improved by mixing said colorant with a specific class of perylene colorants. Using said colorant mixture in applications like a black matrix or black column spacer in LCD devices or black bezel applications results in an improved optical density whereby all of the key requirements for such applications may be maintained.

Accordingly, the present invention relates to a colorant mixture comprising (a) a bis-oxodihydro-indolylene-benzodifuranone colorant of formula

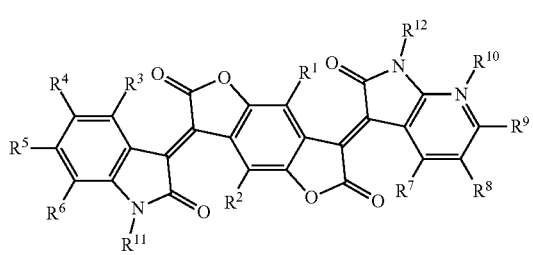

(I)

or an isomer or tautomer or a mixture thereof, wherein $R^1$ and $R^2$ are independently from each other H, $CH_3$, $CF_3$, F or Cl; preferably H or F; more preferably H;

$R^3$ and $R^7$ are independently of each other H, F, Cl, $R^{13}$ or $OR^{13}$; preferably H or F; more preferably H;

$R^4$, $R^5$, $R^6$, $R^8$, $R^9$ and $R^{10}$ are independently of each other H, F, Cl, Br, COOH, $COOR^{13}$, $CONH_2$, $CONHR^{13}$, $CONR^{13}R^{14}$, CN, $COR^{13}$, $SO_3H$, $SO_3R^{13}$, $SO_2NH_2$, $SO_2NHR^{13}$, $SO_2NR^{13}R^{14}$, $SO_2R^{13}$, $NO_2$, $R^{13}$, OH, $OR^{13}$, $SR^{13}$, $NH_2$, $NHR^{13}$, $NR^{13}R^{14}$, $NHCOR^{13}$ or

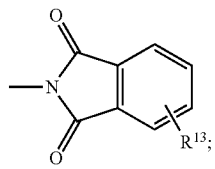

or $R^3$ and $R^4$, $R^4$ and $R^5$, $R^5$ and $R^6$, $R^7$ and $R^8$, $R^8$ and $R^9$, and/or $R^9$ and $R^{10}$ together form a $C_1$-$C_6$alkylenedioxy, $C_3$-$C_6$alkylene, $C_3$-$C_6$alkenylene or 1,4-butadienylene radical, each of which is unsubstituted, mono- or polysubstituted by F, $OR^{13}$, $NO_2$, oxo, thioxo or $SO_3H$;

$R^{11}$ and $R^{12}$ are independently from each other H; $C_1$-$C_{18}$alkyl, $C_3$-$C_{18}$cycloalkyl, $C_3$-$C_{18}$alkenyl, $C_3$-$C_{18}$cycloalkenyl, $C_3$-$C_{18}$alkynyl or $C_2$-$C_{12}$heterocycloalkyl, each of which is unsubstituted, mono- or polysubstituted by F, oxo or thioxo and uninterrupted or interrupted one or more times by O, S or $NR^{13}$; or is $C_7$-$C_{18}$aralkyl, $C_1$-$C_{12}$heteroaryl-$C_1$-$C_8$alkyl, $C_6$-$C_{18}$aryl or $C_1$-$C_{12}$heteroaryl, each of which is unsubstituted, mono- or polysubstituted by oxo, thioxo, F, Cl, Br, COOH, $COOR^{13}$, $CONH_2$, $CONHR^{13}$, $CONR^{13}R^{14}$, CN, $COR^{13}$, $SO_3H$, $SO_2NH_2$, $SO_2NHR^{13}$, $SO_2NR^{13}R^{14}$, $SO_2R^{13}$, $NO_2$, $R^{13}$, $OR^{13}$, $SR^{13}$, $NR^{13}R^{14}$, $NHCOR^{13}$ or

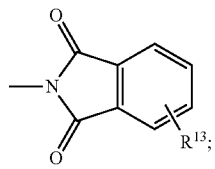

wherein $R^{11}$ and $R^{12}$ are preferably H;

$R^{13}$ and $R^{14}$ are independently of each other $C_1$-$C_{18}$alkyl, $C_3$-$C_{18}$cycloalkyl, $C_3$-$C_{18}$alkenyl, $C_3$-$C_{18}$cycloalkenyl, $C_3$-$C_{18}$alkynyl or $C_2$-$C_{12}$heterocycloalkyl, each of which is unsubstituted, mono- or polysubstituted by F, oxo, thioxo, $OR^{15}$, $SR^{15}$ or $NR^{15}R^{16}$; or is $C_7$-$C_{18}$aralkyl, $C_1$-$C_{12}$heteroaryl-$C_1$-$C_8$alkyl, $C_6$-$C_{18}$aryl or $C_1$-$C_{12}$heteroaryl, each of which is unsubstituted, mono- or polysubstituted by oxo, F, Cl, Br, COOH, $CONH_2$, $CONHR^{15}$, $CONR^{15}R^{16}$, $SO_3H$, $SO_2NH_2$, $SO_2NHR^{15}$, $SO_2NR^{15}R^{16}$, $SO_2R^{15}$, CN, $NO_2$, $OR^{15}$, $SR^{15}$, $NR^{15}R^{16}$, $NHCOR^{15}$ or

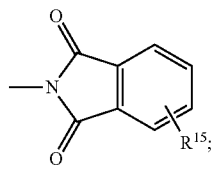

or two vicinal radicals of $R^{13}$ and/or $R^{14}$ together form —O—CO—O—, —O—CS—O—, —CO—N—CO—, —N—CO—N—, —N=S=N—, —N—C=C—, —O—C=C—, —S—C=C—, —O—C=N—, —S—C=N—, —N—N=N—, —N=C—C=C—, —C=N—C=C—, —N=C—C=N—, —C=N—N=C—, —C=N—C=N— or —C=C—C=C—, in which —C= and —N— are independently of each other substituted by H or $R^{15}$;

or two geminal or vicinal radicals of $R^{13}$ and/or $R^{14}$ together form a $C_3$-$C_8$alkylene or $C_3$-$C_8$alkenylene radical, each of which is unsubstituted, mono- or polysubstituted by F, oxo or thioxo, and in which 0, 1 or 2 non-vicinal methylene units may be replaced by O, S or $NR^{15}$;

$R^{15}$ and $R^{16}$ are independently of each other $C_1$-$C_8$alkyl, $C_3$-$C_6$cycloalkyl or benzyl, each unsubstituted, mono- or polysubstituted by oxo, thioxo, F or $C_1$-$C_8$alkoxy; or is phenyl or $C_1$-$C_5$heteroaryl, each of which is unsubstituted, mono or polysubstituted by F, Cl, Br, CO—$C_1$-$C_8$alkyl, COOH, $CONH_2$, $CONHC_1$-$C_8$alkyl, $CON(C_1$-$C_8$alkyl$)_2$, $SO_3H$, $SO_2NH_2$, $SO_2NHC_1$-$C_8$alkyl, $SO_2N(C_1$-$C_8$alkyl$)_2$, CN, $NO_2$, $C_1$-$C_8$alkyl, $C_1$-$C_8$alkoxy, $C_1$-$C_8$thioalkoxy or $N(C_1$-$C_8$alkyl$)_2$;

or two vicinal radicals of $R^{15}$ and/or $R^{16}$ together form —O—CO—O—, —O—CS—O—, —CO—N—CO—, —N—CO—N—, —N=S=N—, —N—C=C—, —O—C=C—, —S—C=C—, —O—C=N—, —S—C=N—, —N—N=N—, —N=C—C=C—, —C=N—C=C—, —N=C—C=N—, —C=N—N=C—, —C=N—C=N— or —C=C—C=C—, in which —C= and —N— are independently of each other substituted by H, F, $C_1$-$C_8$alkyl or $C_1$-$C_8$alkoxy;

or two geminal or vicinal radicals of $R^{15}$ and/or $R^{16}$ together form a $C_3$-$C_8$alkylene or $C_3$-$C_8$alkenylene radical, each of which is unsubstituted, mono- or polysubstituted by oxo or thioxo, and in which 0, 1 or 2 non-vicinal methylene units are replaced by O, S or $N(C_1$-$C_8$alkyl);

and (b) a perylene colorant of formula

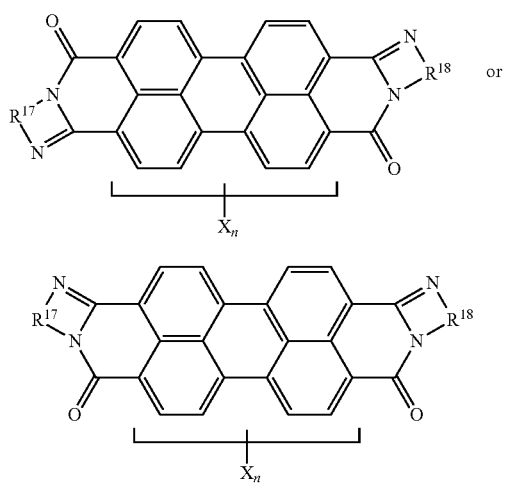

or a mixture thereof, wherein $R^{17}$ and $R^{18}$ are independently of each other phenylene, naphthylene or pyridylene, each of which is unsubstituted, mono- or polysubstituted by $C_1$-$C_{18}$alkyl, $C_1$-$C_{18}$alkoxy, OH, $NO_2$, F, Cl or Br;

X is F, Cl, or Br, preferably Cl or Br; and n is 0, 1, 2, 3 or 4, preferably 0, 2 or 4.

The substituents in formulae (I), (II) and (III) and the general terms used herein have the preferred meanings:

$R^1$ and $R^2$ are preferably H or F.

$R^3$ and $R^7$ are preferably H or F, more preferably H.

Preferably, $R^4$, $R^5$, $R^6$, $R^8$, $R^9$ and $R^{10}$ are independently of each other H, F, Cl, Br, COOH, $COOR^{13}$, $CONH_2$, $CONHR^{13}$, $CONR^{13}R^{14}$, CN, $COR^{13}$, $SO_3H$, $SO_2NH_2$, $SO_2NHR^{13}$, $SO_2NR^{13}R^{14}$, $SO_2R^{13}$, $NO_2$, $R^{13}$, $OR^{13}$, $NHCOR^{13}$, or $R^5$ and $R^6$, and/or $R^9$ and $R^{10}$ together form a 1,4-butadienylene radical, more preferably $R^5$ and $R^9$ are H; and most preferably $R^5$ and $R^9$ are H and $R^4$ is identical with $R^8$, and $R^6$ is identical with $R^{10}$.

More preferred, $R^4$ and $R^8$ are independently of each other H, $NO_2$, F, Cl, Br, $SO_3H$, COOH, $N(CH_3)_2$, $NHCOC_1$-$C_{12}$alkyl, especially $NHCOC_1$-$C_8$alkyl, $C_1$-$C_{12}$alkyl, especially $C_1$-$C_8$alkyl, $C_1$-$C_{12}$alkoxy, especially $C_1$-$C_8$alkoxy.

Preferably, $R^{11}$ and $R^{12}$ are independently of each other H, $C_1$-$C_4$alkyl, or phenyl, more preferably H, methyl, ethyl or phenyl; especially H.

Preferably, $R^{13}$ and $R^{14}$ are independently of each other $C_1$-$C_4$alkyl, each of which is unsubstituted, mono- or polysubstituted by F; or two geminal radicals of $R^{13}$ and $R^{14}$ together form a $C_4$-$C_6$alkylene radical, each of which is unsubstituted, mono- or polysubstituted by F.

$R^{17}$ and $R^{18}$ may be 1,2-phenylene, 1,8-, 1,2- or 2,3-naphthylene or 2,3- or 3,4-pyridylene. Said phenylene, naphthylene or pyridylene may be mono- or polysubstituted by, for example, $C_1$-$C_{12}$alkyl, $C_1$-$C_{12}$alkoxy, OH, $NO_2$, Cl or Br, more preferably $C_1$-$C_4$alkyl, $C_1$-$C_4$alkoxy, OH, $NO_2$, Cl or Br. Especially, said phenylene, naphthylene or pyridylene is unsubstituted. Among them, phenylene and 1,8-naphthylene are more preferred, phenylene being most preferred.

X may be Cl or Br.

n may be 0, 2 or 4, preferably n is 0.

Alkyl, e.g., $C_1$-$C_4$alkyl, $C_1$-$C_8$alkyl, $C_1$-$C_{12}$alkyl or $C_1$-$C_{18}$alkyl, preferably $C_1$-$C_4$alkyl, may be within the given limits of C atoms linear or branched, where possible. Examples are methyl, ethyl, n-propyl, isopropyl, n-butyl, s-butyl, isobutyl, t-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methyl-heptyl, 3-methylheptyl, n-octyl, 2-ethylhexyl, n-nonyl, decyl, undecyl, dodecyl, tetradecyl, hexadecyl and octadecyl. Alkoxy, e.g., $C_1$-$C_4$alkoxy, $C_1$-$C_6$alkoxy or $C_1$-$C_8$alkoxy, $C_1$-$C_{12}$alkoxy or $C_1$-$C_{18}$alkoxy, is alkyl-O—, preferably $C_1$-$C_4$alkoxy; more preferably methoxy or ethoxy.

Alkylene, e.g., $C_1$-$C_6$alkylene, $C_3$-$C_6$alkylene, or $C_3$-$C_8$alkylene, $C_4$-$C_6$alkylene, may be derived from above-defined alkyl by abstracting a H atom from any terminal C atom of the alkyl. Examples are methylene, ethylene, n-, isopropylene, n-, iso-, s-, t-butylene, n-pentylene, n-hexylene, n-heptylene and n-octylene.

Alkenyl, e.g., $C_3$-$C_{18}$alkenyl or $C_3$-$C_5$alkenyl, may be within the given limits of C atoms straight-chain or branched, where possible. Examples are allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, or isododecenyl, Alkenylene, e.g., $C_3$-$C_6$alkenylene, or $C_3$-$C_8$alkenylene, preferably $C_3$-$C_6$alkenylene, may be derived from above-defined alkenyl by abstracting a H atom from any terminal C atom of the alkenyl.

Alkynyl, e.g., $C_3$-$C_{18}$alkynyl, preferably $C_3$-$C_{12}$alkynyl, may be within the given limits of C atoms straight-chain or branched, where possible. Examples are 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl or 1-dodecyn-12-yl.

Cycloalkyl, e.g., $C_3$-$C_6$cycloalkyl, $C_3$-$C_{18}$cycloalkyl, or preferably $C_5$-$C_7$cycloalkyl, may be within the given limits of C atoms cyclopropyl, cyclobutyl, cyclopentyl, cyclohexyl, cycloheptyl, cyclobutyl, cyclodecyl, cycloundecyl, cyclododecyl, methylcyclopentyl, dimethylcyclopentyl, methylcyclohexyl, and di methylcyclohexyl, preferably cyclohexyl.

Cycloalkenyl, e.g., $C_3$-$C_{18}$cycloalkenyl, preferably $C_5$-$C_7$cycloalkenyl, may be within the given limits of C atoms cyclopentenyl, cyclohexenyl, methylcyclopentenyl, dimethylcyclopentenyl and methylcyclohexenyl.

Heterocycloalkyl, e.g., $C_3$-$C_{12}$heterocycloalkyl, preferably $C_5$-$C_7$heterocycloalkyl, may be derived from above-defined cycloalkyl which have one or more hetero atoms selected from NR', O and S, wherein R' is a direct bond, $C_1$-$C_4$alkyl or phenyl. Examples are imidazolidinyl, pyrrolidinyl, pyrazolidinyl, piperidinyl, piperazinyl, morpholinyl, thiomorpholinyl, 1-azepanyl, which are optionally substituted by $C_1$-$C_4$alkyl.

Aryl, e.g., $C_6$-$C_{18}$aryl, preferably $C_6$-$C_{14}$aryl, may be within the given limits of C atoms phenyl, fluorenyl, indenyl, azulenyl, naphthyl, biphenylyl, terphenylyl, phenanthryl, or anthracenyl, preferably phenyl, 1-naphthyl, 2-naphthyl, 9-phenanthryl, 2- or 9-fluorenyl, 3- or 4-biphenylyl.

Aralkyl, e.g., $C_7$-$C_{18}$aralkyl, preferably $C_7$-$C_{12}$aralkyl, may be within the given limits of C atoms benzyl, 2-benzyl-2-propyl, β-phenyl-ethyl (phenethyl), α,α-dimethylbenzyl, ω-phenylbutyl, ω, ω-dimethyl-ω-phenyl-butyl, ω-phenyl-dodecyl, ω-phenyl-octadecyl, in which both the aliphatic and the aromatic hydrocarbon group may be unsubstituted or substituted. Preferred examples are benzyl, phenethyl, α,α-dimethylbenzyl or ω-phenyl-butyl.

Heteroaryl, e.g., $C_1$-$C_5$heteroaryl, $C_1$-$C_{12}$heteroaryl, may be within the given limits of C atoms, for example, 2-thienyl, 2-furyl, 1-pyrazolyl, 2-pyridyl, 2-thiazolyl, 2-oxazolyl, 2-imidazolyl, isothiazolyl, triazolyl, tetrazolyl, or a ring system consisting of thiophene, furan, thiazol, oxazol, imidazole, isothiazole, thiadiazole, triazole, pyridine, pyrazine, pyrimidine, pyridazine and one or two annellated benzene rings. Each heteroaryl may be unsubstituted or substituted one or more times by phenyl or $C_1$-$C_4$alkyl.

The term "mono- or poly-substituted by" or "substituted one or more times by" means substitution of 1 to 6 times, where possible, preferably 1, 2 or 3 times. If a substituent occurs more than once in a group, it may be different in each occurrence.

The term "total solid content" used herein means the total content of components remaining after application and drying, i.e. the total content of non-volatile components.

The term "(meth)acryl" in (meth)acrylic acid or (meth)acrylate means acryl and/or methacryl.

In a preferred embodiment, the colorant mixture comprises
(a) a bis-oxodihydro-indolylene-benzodifuranone pigment of formula (I) or an isomer or tautomer or a mixture thereof, wherein
$R^1$, $R^2$, $R^3$, $R^7$ and are independently of each other H or F, preferably H;
$R^4$, $R^5$, $R^6$, $R^8$, $R^9$ and $R^{10}$ are independently of each other H, F, Cl, Br, COOH, COOR$^{13}$,
CONH$_2$, CONHR$^{13}$, CONR$^{13}$R$^{14}$, CN, COR$^{13}$, SO$_3$H, SO$_2$NH$_2$, SO$_2$NHR$^{13}$, SO$_2$NR$^{13}$R$^{14}$, SO$_2$R$^{13}$, NO$_2$, R$^{13}$, OR$^{13}$, NR$^{13}$R$^{14}$, NHCOR$^{13}$, or
$R^5$ and $R^6$, and/or $R^9$ and $R^{10}$ together form a 1,4-butadienylene radical;
$R^{11}$ and $R^{12}$ are H, CH$_3$ or phenyl, preferably H; and $R^{13}$ and $R^{14}$ are independently of each other $C_1$-$C_{12}$alkyl, each of which is unsubstituted, mono- or polysubstituted by F; or
two geminal radicals of $R^{13}$ and $R^{14}$ together form a $C_5$-$C_7$alkylene radical, each of which is unsubstituted, mono- or polysubstituted by F; and
(b) a perylene pigment of formula (II) or (III) or a mixture thereof, wherein
$R^{17}$ and $R^{18}$ are independently of each other phenylene or naphthylene, each of which is unsubstituted, mono- or polysubstituted by $C_1$-$C_8$alkyl, $C_1$-$C_8$alkoxy, OH, NO$_2$, F, Cl or Br;
preferably phenylene or naphthylene each of which is unsubstituted, mono- or polysubstituted by $C_1$-$C_4$alkyl, $C_1$-$C_4$alkoxy, Cl or Br;
X is Cl or Br, and
n is 0, 1, 2, 3 or 4, preferably n is 0, 2 or 4, more preferably n is 0.

In a more preferred embodiment, the colorant mixture comprises
(a) a bis-oxodihydro-indolylene-benzodifuranone pigment of formula (I) or an isomer or tautomer or a mixture thereof, wherein
$R^1$, $R^2$, $R^3$, and $R^7$ are H;
$R^4$ and $R^8$ are independently of each other H, F, Cl, Br, COOH, CN, SO$_3$H, NO$_2$, R$^{13}$, OR$^{13}$, NR$^{13}$R$^{14}$, NHCOR$^{13}$,
$R^5$ and $R^9$ are independently of each other H, NO$_2$, CN, COOH or SO$_3$H; preferably H or SO$_3$H;
$R^6$ and $R^{10}$ are independently of each other H, F, Cl, R$^{13}$, preferably CH$_3$ or C$_2$H$_5$, OR$^{13}$, preferably OCH$_3$ or OC$_2$H$_5$; preferably H, CH$_3$ or Cl; or
$R^5$ and $R^6$, and/or $R^9$ and $R^{10}$ together form a 1,4-butadienylene radical;
$R^{11}$ and $R^{12}$ are H; and
$R^{13}$ and $R^{14}$ are independently of each other $C_1$-$C_{12}$alkyl, each of which is unsubstituted, mono- or polysubstituted by F; or
two geminal radicals of $R^{13}$ and $R^{14}$ together form a $C_5$-$C_7$alkylene radical, each of which is unsubstituted, mono- or polysubstituted by F; and
(b) a perylene pigment of formula (II) or (III) or a mixture thereof, wherein
$R^{17}$ and $R^{18}$ are independently of each other phenylene or naphthylene, each of which is unsubstituted, mono- or polysubstituted by $C_1$-$C_4$alkyl, $C_1$-$C_4$alkoxy, OH, NO$_2$, Cl or Br; and n is 0.

In an especially preferred embodiment, the colorant mixture comprises
(a) a bis-oxodihydro-indolylene-benzodifuranone pigment of formula (I) or an isomer or tautomer or a mixture thereof, wherein
$R^1$, $R^2$, $R^3$, and $R^7$ are H;
$R^4$ and $R^8$ are independently of each other H, F, Cl, Br, COOH, CN, SO$_3$H, NO$_2$, CH$_3$, C$_2$H$_5$, OCH$_3$, OC$_2$H$_5$, or N(CH$_3$)$_2$;
$R^5$ and $R^9$ are independently of each other H, NO$_2$, CN, COOH or SO$_3$H; preferably H or SO$_3$H;
$R^6$ and $R^{10}$ are independently of each other H, F, Cl, CH$_3$, C$_2$H$_5$, OCH$_3$ or OC$_2$H$_5$; preferably H, CH$_3$ or Cl; or
$R^5$ and $R^6$, and/or $R^9$ and $R^{10}$ together form a 1,4-butadienylene radical;
$R^{11}$ and $R^{12}$ are H; and (b) a perylene pigment of formula (II) or (III) or a mixture thereof, wherein R$^{17}$ and R$^{18}$ are independently of each other phenylene or naphthylene, each of which is unsubstituted, mono- or polysubstituted by C$_1$-C$_4$alkyl, C$_1$-C$_4$alkoxy, OH, NO$_2$, Cl or Br; and n is 0.

In a particularly preferred embodiment, the colorant mixture comprises (a) a bis-oxodihydro-indolylene-benzodifuranone pigment of formula (I) or an isomer or tautomer or a mixture thereof, wherein R$^1$, R$^2$, R$^3$, R$^5$, R$^6$, R$^7$, R$^9$, R$^{10}$, R$^{11}$ and R$^{12}$ are H; and R$^4$ and R$^8$ are the same or independently of each other H, NO$_2$, F, Cl, Br, SO$_3$H, COOH, N(CH$_3$)$_2$, NHCOC$_1$-C$_{12}$alkyl, preferably, NHCOC$_1$-C$_8$alkyl, C$_1$-C$_{12}$alkyl, preferably C$_1$-C$_8$alkyl, C$_1$-C$_{12}$alkoxy, preferably C$_1$-C$_8$alkoxy; especially R$^4$ and R$^8$ are the same; or R$^1$, R$^2$, R$^3$, R$^5$, R$^7$, R$^9$, R$^{11}$ and R$^{12}$ are H; and R$^4$, R$^6$, R$^8$ and R$^{10}$ are independently of each other H, CH$_3$, OCH$_3$, F, Cl or Br, preferably both R$^4$ and R$^8$, and R$^6$ and R$^{10}$ are identical and selected from H, CH$_3$, OCH$_3$, F, Cl or Br; or R$^1$, R$^2$, R$^3$, R$^4$, R$^5$, R$^6$, R$^7$, R$^8$, R$^9$ and R$^{10}$ are H; and R$^5$ and R$^6$, or R$^9$ and R$^{10}$ together form a 1,4-butadienylene radical, preferably both R$^5$ and R$^6$, and R$^9$ and R$^{10}$ together form a 1,4-butadienylene radical;

or

R$^1$, R$^2$, R$^3$, R$^4$, R$^5$, R$^6$, R$^7$, R$^8$, R$^9$ and R$^{10}$ are H; and R$^{11}$ and R$^{12}$ are H, CH$_3$ or phenyl; and (b) perylene pigment (b) is of formula (II) or (III) or a mixture thereof, wherein R$^{17}$ and R$^{18}$ are independently of each other phenylene or 1,8-naphthylene, each of which is unsubstituted; and n is 0, preferably R$^{17}$ and R$^{18}$ are the same and are each unsubstituted phenylene or 1,8-naphthylene, more preferably phenylene, and n is 0.

A further particular embodiment is the a colorant mixture comprising (a) a pigment of formula

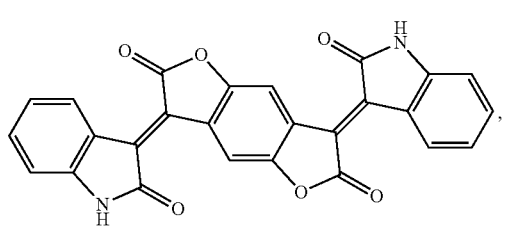
(Ia)

and (b) a pigment of formula (II) or (III), wherein R$^1$ and R$^2$ are the same and are each unsubstituted phenylene or 1,8-naphthylene, preferably phenylene.

The bis-oxodihydro-indolylene-benzodifuranone colorant (a) of formula (I) may be present in different cis-trans isomers. Said cis-trans isomers have the following core structures (omitting the substituents), the trans-trans isomer of the above formula (I) probably being the most stable, the cis-cis isomer probably being the least stable of said isomers.

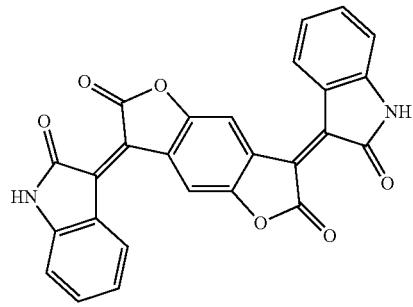
Cis-Cis (Ib)

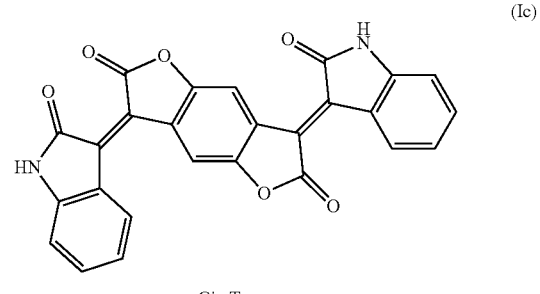
Cis-Trans (Ic)

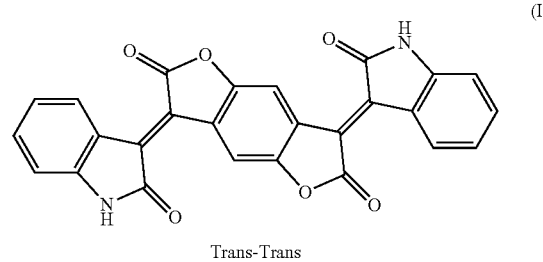
Trans-Trans (Ia)

The bis-oxodihydro-indolylene-benzodifuranone colorant (a) of formula (I) or an isomer or tautomer or a mixture thereof may be obtained in accordance to or in analogy to methods described, for example, in WO-A-2010/081624. The unsubstituted colorant of formula (Ia) may be obtained by reacting 2,5-dihydroxybenzene-1,4-diacid or an ester derivative thereof and isatin in a molar ratio of about 1:2. The reaction is generally performed under acidic catalysis, i.e., with a catalyst having a pKa value ≤4.5 in water at 25° C., e.g. toluene sulfonic acid or the like. Various solvents may be used as reaction medium, for example, an aqueous medium or advantageously an anhydrous reaction medium such as toluene, glacial acetic acid, chlorobenzene or the like. A correspondingly substituted isatin derivative may also be reacted. Further, a mixture of 2, 3, 4 or 5 isatin derivatives including isatin itself may be reacted. Instead of 2,5-dihydroxybenzene-1,4-diacid or an ester derivative thereof, a compound of formula

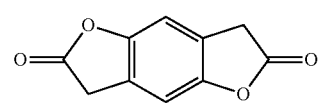
(IV)

may also be used, in which case the crude product formed is preferably converted into a dispersible form, as described in WO-A-2009/010521, for example by wet-milling with milling aids in the presence of a solvent. Suitable solvents and milling equipment for wet-milling and/or recrystallisation are well-known in the art.

Especially suitable colorants (a) used herein are single-phase pigments in which other crystal polymorphs are present in an amount of ≤20% by weight, preferably 10% by weight, based on the total amount of all crystal polymorphs. Such colorants may be obtained by a condensation reaction of 2,5-dihydroxybenzene-1,4-diacid, an ester derivative thereof or a compound of formula (IV) with isatin or a substituted derivative thereof in an anhydrous medium such as toluene, glacial acetic acid, chlorobenzene or the like.

The colorants (a) may comprise one of the isomers of formula (Ia), (Ib) or (Ic), a tautomer thereof or a mixture of at least two of them.

The perylene colorant of formula (II) or (III) may be obtained in accordance to or in analogy to the methods described, for example, in US-A-2007/00151478. The crude colorants obtainable by known methods as described, for example, in CH 373 844 or GB 972 485, may be transformed into a suitable pigment by comminution and, if desired, recrystallization in a liquid medium, by comminution with simultaneous recrystallization.

The colorants (b) may comprise one of the isomers of formula (II) or (III) or may comprise a mixture of both isomers which may be a physical mixture or preferably a solid solution (mixed crystal) of compounds of formula (II) and (III).

Especially, the colorant mixture of the invention comprises colorant (a) and colorant (b) in weight ratio of from 80:20 to 10:90 by weight, preferably, 65:35 to 10:90, and more preferably 60:40 to 10:90.

It is well known in the art that a primary particle diameter of pigments is preferably smaller than the wavelength of transparent region of the color filters in order not to lose transparency due to scattering of light. The colorants (a) and (b) (including colorants (c) mentioned below), preferably pigments, have an average particle diameter of generally ≤500 nm, preferably ≤200 nm, more preferably ≤100 nm, and most preferably ≤60 nm, especially of from 10-60 nm.

The average particle diameter is so-called average particle diameter of dispersed particles that is determined based on a particle diameter measured by any known method, for example, a dynamic laser scattering. The technique is well known per se, and precision instruments are available, for example from Malvern Instruments Ltd. (Malvern, Worcestershire/UK).

In LCD industry it is common to estimate the particle size/distribution of the pigments from the pigments dispersion. Here, it is necessary to pay attention for dilution of the dispersion to avoid a so-called "solvent shock", i.e. particles are aggregated when quickly diluted. For example, the dilution of the dispersion can be carried out as follows: 0.1 g of pigments dispersion containing ca.10~15% pigments is mixed with 0.4 g of the solvent used, commonly propylene glycol 1-monomethyl ether 2-acetate (PGMEA), and applied to an ultrasound bath at room temperature for 5 minutes, then 1.6 g of PGMEA is added to the dispersion and again applied 5 minutes of the ultrasound, and further 8 g of PGMEA is added and applied 5 minutes of the ultrasound to give 100 times gently diluted dispersion for the particle size measurement.

Micronisation techniques in obtaining such small particles have been known in industry, for example, various milling methods with/without inorganic salt such as dry milling, wet milling, roll milling, ball milling, beads milling, sand milling, Henschel milling, pin milling, dispersion milling, salt kneading, reprecipitation or recrystallization under various conventional conditions. Suitable particles of pigments of formula (I) can be obtained, by methods described for example in WO-A-2010/081624. Suitable particles of pigments of formula (II) or (III) or mixtures thereof can be obtained by methods described for example in US-A-2007/00151478.

One or more further colorants may be used in the colorant mixture of the invention, for example, in order to enhance optical density at a desired wavelength, to expand spectrum coverage, and to precisely adjust black color, e.g. bluish black or reddish black, depending on the backlight emission profile and on the display design, etc. The further colorant(s) may be a black colorant or a colorant different colored from black. The further colorant may be, for example, carbon black, phthalocyanine, subphthalocyanine, naphthalocyanine, dioxazine, indanthrone, indigo, thioindogo, anthraquinone, quinacridone, diketopyrrolopyrrole, dithioketopyrrolopyrrole, perylene, perinone, monoazo, disazo, β-naphthol, benzimidazolone, disazo condensation, isoindolinone, isoindoline, quinophthalone, anthrapyrimidine, pyrimidopteridine, flavanthrone, pyranthrone, anthanthrone, triarylcarbonium pigments and dyes, lake pigments, metal complexes, inorganic pigments like metal oxides and dyes.

Suitable examples of the further colorant may be a black colorant such as C.I. Pigment Black 1, 6, 7, 11, 12, 20, 25, 27, 30, 31 and 32, C.I. Solvent Black 2, 3, 27, 28, 29 and 46, C.I. Acid Black 9, 52, 194; a red or violet colorant such as C.I. Pigment Red 2, 3, 4, 9, 12, 23, 48:1, 48:2, 48:3, 48:4, 52:2, 53:1, 57:1, 81:2, 81:5, 97, 101, 105, 112, 122, 123, 144, 149, 166, 168, 169, 176, 177, 178, 179, 180, 185, 192, 202, 206, 207, 209, 214, 222, 233, 242, 244, 254, 255, 264, 272 and 282, C.I. Solvent Red 25, 27, 30, 35, 49, 83, 89, 100, 122, 138, 149, 150, 160, 179, 218 and 230, and C.I. Direct Red 20, 37, 39 and 44, and C.I. Acid Red 6, 8, 9, 13, 14, 18, 26, 27, 51, 52, 87, 88, 89, 92, 94, 97, 111, 114, 115, 134, 145, 151, 154, 180, 183, 184, 186 and 198, and C.I. Basic Red 12 and 13, and C.I. Disperse Red 5, 7, 13, 17 and 58, C.I. Pigment Violet 14, 19, 23, 29, 32, 37 and 42; a green or blue colorant such as C.I. Pigment Green 1, 7, 36 and 58, and C.I. Acid Green 3, 9 and 16, and C.I. Basic Green 1 and C.I. Pigment Blue 1, 15, 15:1, 15:2, 15:3, 15:4, 15:6, 16, 22, 28, 60, 63, 64, 66, 71, 72, 73, 75 and 80, and C.I. Solvent Blue 25, 49, 68, 78 and 94, and C.I. Direct Blue 25, 86, 90 and 108, and C.I. Acid Blue 1, 7, 9, 15, 103, 104, 158 and 161, and C.I. Basic Blue 1, 3, 9 and 25, and C.I. Disperse Blue 198; a yellow colorant such as C.I. Pigment Yellow 3, 12, 13, 14, 15, 17, 20, 24, 31, 34, 42, 53, 55, 74, 83, 93, 95, 109, 110, 111, 117, 125, 128, 129, 138, 139, 147, 150, 153, 154, 155, 166, 168, 174, 180, 185, 188, 199, 213, 215, C.I. Solvent Yellow 2, 5, 14, 15, 16, 19, 21, 33, 56, 62, 77, 83, 93, 162, 104, 105, 114, 129, 130, 162, C.I. Disperse Yellow 3, 4, 7, 31, 54, 61, 201, C.I. Direct Yellow 1, 11, 12, 28, C.I. Acid Yellow 1, 3, 11, 17, 23, 38, 40, 42, 76, 98, CA. Basic Yellow 1, C.I. Pigment Brown 29, 33, C.I. Direct Brown 6, 58, 95, 101, 173, and C.I. Acid Brown 14, and mixtures thereof. The carbon blacks may be various carbon blacks (C.I. Pigment Black 7) like channel blacks, furnace blacks and lamp blacks. The surface of carbon black may be treated with, e.g., a resin.

The colorant mixture preferably comprises one or more colorants of carbon black and/or organic pigments and dyes. For example, the organic pigments and dyes are selected from the group consisting of phthalocyanine, dioxazine, indanthrone, anthraquinone, quinacridone, diketopyrrolopyrrole, perylene, monoazo, disazo, benzimidazolone, disazo condensation, isoindolinone, isoindoline, quinophthalone, pyrimidopteridine, pyranthrone pigments and dyes. An especially preferred colorant mixture comprises carbon black or one or more organic pigments or a mixture thereof. Such pigments are commercially available in, for example, either powder or press cake form.

The further colorant may be present in the colorant mixture of the instant invention in an amount only, where the properties like low conductivity and optical density are not be adversely affected. The further colorant(s) may be present in an amount of ≤50% by weight, based on the total weight of colorants (a) and (b), preferably ≤30% by weight, more preferably of from 0.1 to 20% by weight in case organic pigment(s) or dye(s) are used. If carbon black is used as the further colorant, the carbon black may be present in an amount is of ≤30% by weight, preferably ≤20% by weight, more preferably from 0.1 to 15% by weight.

Accordingly, a preferred embodiment relates to a colorant mixture, wherein
(c) at least one further colorant is present in an amount of 0-50% by weight, based on the total weight of colorants (a) and (b), preferably ≤30% by weight, more preferably in amount of from 0.1 to 20% by weight;
with the proviso that the amount for carbon black as a colorant is ≤30% by weight.

Where the colorant mixture comprises one or more pigments as colorants, it is preferred to add a dispersant to the colorant mixture in order to make the pigment easy to disperse and to stabilize the resultant colorant dispersion. The dispersants are, for example, surfactants, polymeric dispersants, texture improving agents or a mixture thereof. It is especially preferred when the colorant mixture of the invention comprises at least one polymeric dispersant and/or at least one pigment derivative.

Suitable polymeric dispersants improve pigment dispersion and reduce interparticulate attraction within that dispersion. The improved dispersion means a small average particle size (or particle size reduction achieved in a shorter milling time) with a narrower particle size distribution. Dispersions are significantly more stable to flocculation and agglomeration than those produced by conventional means. Suitable polymeric dispersants possess a two-component structure comprising a polymeric chain and an anchoring group. The particular combination of these leads to their effectiveness.

Examples of suitable polymeric dispersants include polycarboxylates such as polyurethanes and polyacrylates; unsaturated polyamides; (partial) amine salts, ammonium salts and alkyl amine salts of polycarboxylic acids; polysiloxanes; long-chain polyaminoamide phosphates; hydroxyl group-containing polycarboxylates; and modified products thereof; amides formed by reacting polyesters having a free carboxylic acid group with poly(lower alkylene imines) and salts thereof; and the like, and those available under the trade name of Disperbyk® 101, 115, 130, 140, 160, 161, 162, 163, 164, 165, 166, 168, 169, 170, 171, 180, 182, 2000, 2001, 2050, 2070, 2090, 2091, 2095, 2096, 2105, 2150, 21116, 21158, 21208 and the like, EFKA® 4008, 4009, 4010, 4015, 4020, 4044, 4046, 4047, 4050, 4055, 4060, 4061, 4300, 4310, 4320, 4330, 4340, 7700, 7701, 7702, 7711, 7731, 7732; Ajisper PB® 711, 821, 822, 823, 824, 827; Solsperse® 13240, 13940, 17000, 24000GR, 28000, 20000, 12000, 27000, 31845, 32000, 32500, 32550, 32600, 33500, 34750, 36000, 36600, 37500, 39000, 41090, 44000, 53095 and combinations thereof.

A suitable surfactant is, for example, a cationic, anionic, non-ionic or amphoteric surfactant, or a silicone-based or fluorine-based surfactant.

Examples of suitable surfactants include polyoxyethylene alkyl ethers such as polyoxyethylene lauryl ether, polyoxyethylene stearyl ether and polyoxyethylene oleyl ether; polyoxyethylene alkylphenyl ethers such as polyoxyethylene octylphenyl ether and polyoxyethylene nonylphenyl ether; polyethylene glycol diesters such as polyethylene glycol dilaurate and polyethylene glycol distearate; sorbitan fatty acid esters; fatty acid modified polyesters; tertiary amine modified polyurethanes; polyethylene imines; and the like, and those available under the trade name of KP, Polyflow F-Top, Megafax, Florade, Asahi Guard and Surflon and the like. These surfactants may be used alone or in admixture of two or more.

Examples of suitable texture improving agents are fatty acids such as stearic acid or behenic acid, and fatty amines such as laurylamine and stearylamine, fatty alcohols or ethoxylated fatty alcohols, polyols such as aliphatic 1,2-diols or epoxidized soy bean oil, waxes, resin acids and resin acid salts.

One or more dispersant selected from a polymeric dispersant, a surfactant or a texture improving agent may be present in an amount of at most 40% by weight, preferably at most 35% by weight, based on the total weight of the colorants (a), (b) and (c), if present.

Accordingly, a preferred embodiment relates to a colorant mixture, wherein
(d) a dispersant, preferably a polymeric dispersant is present in an amount of ≤40% by weight, preferably ≤35% by weight, based on the total weight of the colorants (a), (b) and (c), if present.

In addition to the colorants (a) and (b) and optionally a further colorant (c) and a dispersant (d), the colorant mixture of the invention may also comprise a pigment derivative (e).

Pigment derivatives are generally pigment chromophores substituted by apolar or (usually) polar groups, typically $C_4$-$C_{30}$alkyl, $C_4$-$C_{30}$alkoxy, $C_4$-$C_{30}$alkylthio, aminomethyl, sulpho, carboxyl, amidosulphonyl or amidocarbonyl groups. Such pigment derivatives are often referred to as synergists in the field of color filters. Any known pigment derivative can be used, for example, synergists or else pigment derivatives known from other fields for use as rheology improvers, dispersants, crystal growth retardants or warpage inhibitors in plastics, liquid inks or coatings for example.

Typical chromophores of suitable pigment derivatives are, for example, 1-amino-anthraquinone, anthanthrone, anthrapyrimidine, azo, azomethine, quinacridone, quinacridonequinone, quinophthalone, dioxazine, diketopyrrolopyrrole, flavanthrone, indanthrone, isoindoline, isoindolinone, isoviolanthrone, perinone, perylene, phthalocyanine, pyranthrone or thioindigo chromophores, including where appropriate metal complexes or lakes thereof. The azo chromophore may comprise, for example, mono- or disazo chromophores of any known subclass, obtainable for example by coupling, condensation or laking.

Organic pigments whose chromophores can be substituted to form colorant derivatives are for example C.I. Pigment Yellow 3, 12, 13, 14, 17, 24, 34, 42, 53, 62, 74, 83, 93, 95, 108, 109, 110, 111, 119, 123, 128, 129, 139, 147, 150, 164, 168, 173, 174, 184, 188, 191, 191:1, 193, 199, C.I. Pigment Orange 5, 13, 16, 34, 40, 43, 48, 49, 51, 61, 64, 71, 73, C.I. Pigment Red 2, 4, 5, 23, 48:1, 48:2, 48:3, 48:4, 52:2, 53:1, 57, 57:1, 88, 89, 101, 104, 112, 122, 144, 146, 149, 166, 168, 177, 178, 179, 181, 184, 190, 192, 194, 202, 204, 206, 207, 209, 214, 216, 220, 221, 222, 224, 226, 254, 255, 262, 264, 270, 272, C.I. Pigment Brown 23, 24, 33, 42, 43, 44, C.I. Pigment Violet 19, 23, 29, 31, 37, 42, C.I. Pigment Blue 15, 15:1, 15:2, 15:3, 15:4, 15:6, 16, 28, 29, 60, 64, 66, C.I. Pigment Green 7, 17, 36, 37, 50, Pigment Black 7, 12, 27, 30, 31, 32, Vat Red 74, 3,6-di(3'-cyanophenyl)-2,5-dihydropyrrolo[3,4-c]pyrrole-1,4-dione or 3-phenyl-6-(4'-tert-butylphenyl)-2,5-dihydropyrrolo[3,4-c]pyrrole-1,4-dione.

Examples of suitable pigment derivatives are copper phthalocyanine derivatives such as Solsperse® 5000 or 12000 (Lubrizol Corp., USA), or BYK's synergist 2100, or azo derivatives such as Solsperse® 22000 and Synergist 2105. Further suitable examples are pyrazole-containing pigment derivatives, as for example disclosed in EP-A-0485337, or quinophthalone derivatives, for example described in US-A-2003/0172847; perylene based pigment derivatives as disclosed, for example in US-A-2007/0151478 or US-A-2004/0215015, and derivatives disclosed, for example in WO-A-02/10288 or WO-A-2009/144115.

A preferred embodiment relates to a colorant mixture, wherein a pigment derivative (e) is present in an amount of ≤25% by weight, based on the total weight of the colorants (a), (b) and (c), if present, preferably ≤15% by weight, more preferably in amount of from 0.1 to 10% by weight.

Preference is given to pigment derivatives having little if any absorption in the UV range of 310-380 nm. This transmission window provides for particularly good actinic modification of the compositions of the invention.

It is especially preferred when the colorant mixture of the invention comprises at least one polymeric dispersant and/or at least one pigment derivative, in particular a combination of a polymeric dispersant and a pigment derivative.

A further preferred embodiment relates to a colorant mixture, wherein, in addition to components (a), (b) and optionally (c), (d) a polymeric dispersant is present in an amount of ≤40% by weight, and (e) a pigment derivative is present in an amount of ≤25% by weight, based on the total weight of the colorants (a), (b) and (c), if present.

The dispersants may be preferably applied to the micronisation process but also applicable to dispersion making process. The pigment derivatives may also be added as early as in the course of colorant synthesis or during pigment finishing, i.e. the conversion of the crude pigments.

The colorants, preferably pigments, (a), (b) and optionally (c) are generally dispersed in a solvent prior to mixing with the resin composition for the final application. In dispersion of these pigments use of a dispersant and/or pigment derivative is preferred to improve the dispersion and stability of the dispersion.

Any suitable solvent may be used, aqueous or non-aqueous. Suitable examples are mentioned below with respect to the photosensitive resist formulation.

The colorant mixture of the invention to be applied in compositions for final application is preferably prepared in the form of a pigment dispersion in advance. The pigment dispersion may be prepared by a variety of methods. For example, pigment, solvent, optionally dispersant and pigment derivative may be dispersed in predetermined amounts through a dispersion step. The dispersion step may be carried out using a paint conditioner, sand grinder, ball mill, roll mill, stone mill, jet mill or homogenizer. If present in the colorant mixture of the invention, dyes as colorant (a), (b) or (c) may also added. If desired, other suitable additives or parts of a binder of the composition to be used for final applications may be present during dispersion step. Dispersion time may be suitably adjusted corresponding to the equipment used. Dispersion temperature can be varied, for example from 0° C. or more, at room temperature or up to 100° C.

Accordingly, a preferred embodiment relates to the colorant mixture comprising a solvent and colorants (a) and (b) and optionally (c), dispersant (d) and pigment derivative (e) in form of a dispersion.

The present invention also relates to a pigment dispersion comprising a solvent and the black colorant mixture comprising (a) a bis-oxodihydro-indolylene-benzodifuranone pigment of formula (I) or an isomer or a tautomer or a mixture thereof, (b) a perylene pigment of formula (II) or (II) or a mixture thereof, (c) optionally a further colorant, (d) a dispersant, preferably a polymeric dispersant, and (e) a pigment derivative.

The black colorant mixture or the pigment dispersion may be used in various applications, for example for coloring any material where high blackness is desired, for example, in the form of plastic materials, coatings or inks, especially for coloring elements in the field of display devices.

The present invention also relates to a composition comprising (A) 0.01-70% by weight, based on the total weight of the composition, of the colorant mixture as defined in any aspect herein-before, and (B) a high molecular weight organic material.

The high molecular weight organic material (B) has a molecular weight in the range of 500 to $10^8$ g/mol and may be natural or synthetic origin. Preferably, the high molecular weight organic material may be any organic binder or other curable or polymerizable precursors. The material may also a polymerizable mixture comprising at least one ethylenically unsaturated polymerizable compound. The material (B) is especially a curable resin.

The present invention also relates to a curable coating composition comprising the black colorant mixture as described in any aspects herein-before, a curable resin and a solvent. The curable resin may be any resin known in the art. The solvent may be either aqueous or non-aqueous. The resin may be cured by various methods, for example, thermally or by any source of radiation such infrared or UV radiation. The curable coating composition may be thermosensitive or photosensitive. In case of a photosensitive coating composition, generally known as a photosensitive resist formulation, the composition may further comprise a photoinitiator.

Especially, the invention relates to a black photosensitive resist formulation comprising the black colorant mixture (a) and (b) and optionally a further colorant (c), a dispersant (d) and a pigment derivative (e). The black photosensitive resist formulation may be used for manufacturing a black element like a black matrix for a color filter or a black column spacer for a liquid crystal display (LCD) device.

The term "black element" used herein includes a black matrix for color filter, a black column spacer and a black bezel for a display device.

The present invention also relates to a photosensitive resist formulation comprising the colorant mixture as defined herein-before and a binder. Preferably, the photosensitive resist formulation comprises (A) the black colorant mixture comprising (a) and (b), and optionally (c), (d) and (e), (B) a binder, preferably an alkali-soluble resin, (C) an ethylenically unsaturated monomer, and (D) optionally a photoinitiator.

The colorant mixture (A) comprising (a) and (b), and optionally (c) (d) and (e), may be present in an amount of from 10-70% by weight, preferably 15-60% by weight, more preferably 20-50% by weight based on the total solid content of the resist formulation.

With regard to the binder (B), any desired alkali-soluble resin having a carboxyl group or hydroxyl group may be used without restriction in the formulation of the invention. Examples of such resins include epoxy acrylate resins, novolak resins, polyvinyl phenol resins, acrylic resins, carboxyl-group containing epoxy resins and carboxyl-group containing urethane resins or a mixture thereof. Examples are, for example, disclosed in WO-A-08/101841, page 18, line 28-page 25, line 21 or WO-A-2006/037728. A preferred binder is an alkali-soluble acrylic resin.

A preferred binder is a polymer containing a carboxyl group, particularly a copolymer (hereinafter referred to as "carboxyl group-containing copolymer") of an ethylenically unsaturated monomer having at least one carboxyl group (hereinafter referred to as "carboxyl group-containing unsaturated monomer") and one or more other copolymerizable, ethylenically unsaturated monomers (hereinafter referred to as "other unsaturated monomer").

Examples of the carboxyl group-containing unsaturated monomer include unsaturated monocarboxylic acids such as acrylic acid, methacrylic acid, crotonic acid, α-chloroacrylic acid, ethacrylic acid and cinammic acid; unsaturated dicarboxylic acids (anhydrides) such as maleic acid, maleic anhydride, fumaric acid, itaconic acid, itaconic anhydride, citraconic acid, citraconic anhydride and mesaconic acid; unsaturated polycarboxylic acids (anhydrides) having at least 3 carboxyl groups in the molecule; mono(meth)acryloyloxyalkyl esters of non-polymerizable dicarboxylic acids such as mono(2-acryloyloxyethyl)ester of succinic acid, mono(2-methacryloyloxyethyl)ester of succinic acid, mono(2-acryloyloxyethyl)ester of phthalic acid and mono(2-methacryloyl-oxyethyl)ester of phthalic acid; ω-carboxy-polycaprolactone monoacrylate, ω-carboxy-polycaprolactone monomethacrylate and the like. These carboxyl group-containing unsaturated monomers may be used alone or in admixture of two or more. (Meth)acrylic acid is preferred.

Examples of the other unsaturated monomer include aromatic vinyl compounds such as styrene, α-methylstyrene, o-, m-, p-vinyltoluene, o-, m-, p-chlorostyrene, o-, m-, p-methoxystyrene, p-vinylbenzyl methyl ether and p-vinylbenzyl glycidyl ether; unsaturated carboxylates such as methyl (meth)acrylate, ethyl (meth)acrylate, n-propyl (meth)acrylate, n-butyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, allyl (meth)acrylate, benzyl (meth)acrylate, phenyl (meth)acrylate and methoxytriethylene glycol (meth)acrylate; unsaturated aminoalkyl carboxylates such as 2-aminoethyl (meth)acrylate, 2-dimethylaminoethyl (meth)acrylate, 2-aminopropyl (meth)acrylate, 2-dimethylaminoproyl (meth)acrylate, 3-aminopropyl (meth)acrylate and 3-dimethylaminopropyl (meth)acrylate; unsaturated glycidyl carboxylates such as glycidyl (meth)acrylate; vinyl carboxylates such as vinyl acetate, vinyl propionate, vinyl butyrate and vinyl benzoate; unsaturated ethers such as vinylmethyl ether, vinylethyl ether, allyl glycidyl ether and methallyl glycidyl ether; vinyl cyanide compounds such as (meth)acrylonitrile, α-chloroacrylonitrile and vinylidene cyanide; unsaturated amides and unsaturated imides such as (meth)acrylamide, α-chloroacrylamide, N-(2-hydroxyethyl) (meth)acrylamide, maleimide, N-phenylmaleimide and N-cyclohexylmaleimide; aliphatic conjugated dienes such as 1,3-butadiene; macromonomers having a mono(meth)acryloyl group at the terminal of a polymer molecular chain such as polystyrene, polymethyl (meth)acrylate, poly-n-butyl (meth)acrylate, and polysiloxane; and the like. These other unsaturated monomers may be used alone or in admixture of two or more.

Preferred other unsaturated monomers are at least one monomer selected from the group consisting of styrene, methyl (meth)acrylate, ethyl (meth)acrylate, n-butyl (meth)acrylate, 2-hydroxyethyl (meth)acrylate, allyl (meth)acrylate, benzyl (meth)acrylate, phenyl (meth)acrylate, glycerol mono(meth)acrylate, N-phenylmaleimide, polystyrene macromonomer and polymethyl (meth)acrylate macromonomer.

The proportion of the carboxyl group-containing unsaturated monomer in the carboxyl group-containing copolymer is generally 5 to 50 wt %, preferably 10 to 40 wt %, more preferably 10 to 30 wt %, based on the total weight of the binder. Generally, the other unsaturated monomer is present in the copolymer of from about 10 to about 90% by weight, preferably 20 to 85% by weight and more preferably 50 to 85% by weight and especially 60 to 80% by weight, based on the total weight of the copolymer.

The carboxyl group-containing copolymer is especially a copolymer of (1) a carboxyl group-containing unsaturated monomer comprising acrylic acid and/or methacrylic acid as an essential component, and mono(2-acryloyloxyethyl)ester of succinic acid and/or mono(2-methacryloyloxyethyl)ester of succinic acid in some cases, and (2) at least one monomer selected from the group consisting of styrene, methyl (meth)acrylate, ethyl (meth)acrylate, n-butyl (meth)acrylate, 2-hydroxyethyl (meth)acrylate, allyl (meth)acrylate, benzyl (meth)acrylate, phenyl (meth)acrylate, glycerol mono(meth)acrylate, N-phenylmaleimide, polystyrene macromonomer and polymethyl (meth)acrylate macromonomer.

The polymers and copolymer of the binder may be a random copolymer or a block copolymer. The (co)polymers usually have a weight average molecular weight in terms of polystyrene measured by gel permeation chromatography (GPC: tetrahydrofuran as a solvent) (hereinafter referred to as "weight average molecular weight" Mw) of 500 to 1,000,000 g/mol, preferably 1,000 to 500,000, more preferably 3,000 to 100,000. The ratio of the weight average molecular weight to the number average molecular weight is preferably 1 to 5, more preferably 1.5 to 4.

The binder (B) may be present in an amount of at least 10% by weight, preferably 15% by weight, more preferably 20% by weight, based on the total solid content of the resist formulation. Generally, the binder is present in an amount of ≤95% by weight, preferably ≤90% by weight.

The resist formulation of the invention includes preferably, but not necessarily, one or more photoinitiators (D). Photoresists comprise a photoinitiator and a polycross-linkable monomer (negative radical polymerization), a material to cross-link the polymers itself (for example a photoacid generator or the like) or a material to chemically change the solubility of the polymer in certain developing media. This process, however, can also be done with heat (for example using thermal arrays or a NIR beam) instead of UV, in the case of some polymers, which undergo chemical changes during heating processes, resulting in changes of solubility in the mentioned developing media. Then, there is no need for a photoinitiator.

Examples of suitable photoinitiators are, for example, a compound having a bis-imidazole ring, benzoin-based compound, acetophenone-based compound, benzophenone-based compound, ketal compound, α-diketone-based compound, polynuclear quinone-based compound, xanthone-based compound, or triazine-based compound, as disclosed, for example, in WO-A-08/101841, and further oximeester-based compound, for example, described in EP-A-1095313, WO-A-2006/018405, WO-A-2007/071797, WO-A-2007/071497, WO-A-2007/062963, WO-A-2005/080337, JP-A-2010/049238, WO-A-2008/078678, JP-A-2008/151967, JP-A-2010/015025, JP-A-2010/049238, WO-A-2009/019173 and WO-A-2011/152066. The photoinitiators may be used in combination with a sensitizer, a curing promoting agent, a photo-crosslinking agent or photosensitizer composed of a polymer compound.

The total amount of the photoinitiator is preferably of from 0.01-10% by weight, more preferably 0.05-8% by weight and most preferably 1-5% by weight, based on the total solid content of the resist formulation.

The ethylenically unsaturated monomer (C) may be a compound having one or more ethylenically unsaturated bonds in the molecule including corresponding oligomers. Typical examples include esters of unsaturated carboxylic acids with polyhydroxy compounds, phosphates containing (meth)acryloyloxy groups, urethane (meth)acrylates of hydroxy (meth) acrylate compounds with polyisocyanate compounds, and epoxy (meth)acrylates of (meth)acrylic acid or hydroxy (meth)acrylate compounds with polyepoxy compounds.

Preferred compounds are polyacrylate monomers, for example, described in WO-A-WO-A-2007/113107. Examples are polyethylene glycol mono(meth)acrylate, polypropylene glycol mono(meth)acrylate, phenoxyethyl (meth)acrylate, polyethylene glycol di(meth)acrylate, ethylene glycol di(meth)acrylate, trimethylol propane tri(meth) acrylate, neopentylglycol di(meth)acrylate, pentaerythritol tri(meth)acrylate, pentaerythritol tetra(meth)acrylate, dipentaerythritol penta(meth)acrylate, dipentaerythritol hexa(meth)acrylate, dipentaerythritol penta-/hexa acrylate, tri(acryloyloxyethyl) isocyanurate, glycerol 1,3-diglycerolate diacrylate, ethylene glycol diglycerolate diacrylate, poly(ethylene glycol) diglycerolate diacrylate, 1,3-propylene glycol diglycerolate diacrylate, poly(propylene glycol) diglycerolate diacrylate and the like. The unsaturated monomer (C) may be used alone or in any desired mixture.

The total amount of the monomer (C) is preferably of from 5-70% by weight, more preferably 5-50% by weight and most preferably 7-30% by weight, based on the total solid content of the resist formulation.

Further, the resist formulation may comprise various suitable additives known in the art. Examples are polymerization accelerators, crosslinking agents, adhesion improvers, organic carboxylic acids or anhydrids, surfactants, thermal polymerization inhibitors, sensitizing dyes, plasticizers, fillers, storage stabilizers and the like.

Each component contained in the present curable coating composition, especially the photosensitive resist formulation, is used after dissolution or dispersion in a solvent (E). Preferably, the pigment dispersion as described herein-before may be used. Generally, the dispersion is mixed with the further components, and the mixture is homogenized to prepare a curable coating composition. Each component may be completely dissolved or may be homogenously dispersed in the solvent. The solvent may be aqueous or non-aqueous, preferably non-aqueous. The composition may be passed through a filter. This method may also be applied to prepare the photosensitive resist formulation.

Examples of suitable solvents (E) are ethylene glycol monomethyl ether acetate, propylene glycol monomethyl ether acetate, propylene glycol monoethyl ether acetate, diethylene glycol dimethyl ether, cyclohexanone, 2-heptanone, 3-heptanone, ethyl 2-hydroxypropionate, 3-methyl-3-methoxybutyl propionate, ethyl 3-methoxypropionate, methyl 3-ethoxypropionate, ethyl 3-ethoxypropionate, n-butyl acetate, isobutyl acetate, n-amyl acetate, isoamyl acetate, n-butyl propionate, ethyl butyrate, isopropyl butyrate, n-butyl butyrate, and ethylpyruvic acid are preferred from the viewpoint of solubility, pigment dispersibility and coating properties. The solvents may be used alone or in any combination. Also a high-boiling solvent like γ-butyrolactone may be used in combination with the above-mentioned solvents.

The amount of the solvent in the resist formulation is generally of from 60 to 90% by weight, based on the total weight of the photosensitive resist formulation.

Typical components of (B) to (E) of the photosensitive resist formulation are described in various prior art, for example, in EP-A-1095313, WO-A-2006/18405, WO-A-2007/71797, WO-A-2007/71497, WO-A-2005/080337, JP-A-2010/49238, WO-A-2008/078678, JP-A-2008/151967, JP-A-2010/015025, WO-2011/152066, WO-A-2006/037728, WO 2007/113107, WO-A-2011/138287 and WO-A-138176. Further, a manufacturing process for making color filters is also well known and may be based photolithography, ink-jet printing, offset printing, gravure printing, relief printing, screen printing, stamp printing, continuous reversal printing and/or electrodeposition, for example as described in WO-A-2006/37728.

The photosensitive resist formulation of the present invention may be used for manufacturing a black matrix for a color filter or for manufacturing a black spacer column for a LCD display device.

Accordingly, the present invention also relates to a coating film formed by curing the resist formulation as described herein-before in any aspect, which film is a black matrix for a color filter or a black column spacer in a liquid crystal display device.

Another embodiment of the invention relates to a black matrix for a color filter comprising the inventive colorant mixture as described above, preferably a cured coating film of a photosensitive resist formulation.

Any substrate suitable for a color filter may be used, for example a glass substrate or a plastic substrate, like polycarbonate, polyester, aromatic polyamide, polyamideimide, polyimide, polyethersulfone or the like, also a temperature sensitive substrate, which means a substrate to be subjected to a maximum temperature of 90° C. without deteriorating.

A color filter is generally prepared by providing red, green and blue (RGB) pixels and, optionally yellow a/o white, with a black matrix separating the pixels on a transparent substrate and providing a transparent electrode either on the surface of the substrate or on the surface of the color filter layer. Said pixels and black matrix usually comprise a photosensitive resin layer comprising correspondingly colored colorants. In the manufacture of color filters the transparent electrode layer can either be applied on the surface of the transparent substrate or can be provided on the surface of the red, green and blue pixels and the black matrix. The transparent substrate is, for example, a glass substrate, which can additionally have an electrode layer on its surface. Also plastic sheets are In a different embodiment of a color filter for a LCD, according to U.S. Pat. No. 5,626,796, the black matrix can also be applied on the substrate opposite to the RGB color filter element-carrying substrate, which is separated from the former by a liquid crystal layer.

If the transparent electrode layer is deposited after applying the RGB pixels and the black matrix, an additional overcoat film as a protective layer can be applied on the color filter layer prior to depositing the electrode layer, for example, as described in U.S. Pat. No. 5,650,263.

The black matrix may be manufactured by forming said matrix on a substrate using the photosensitive resist formulation by a photolithographic method. The resist formulation prepared in the form of a solvent developing type or alkali developing type resist can be applied onto any substrate, e.g., a transparent substrate and a TFT element substrate. The method of coating may be any suitable method known in the field of color filter. Coating may be carried out by, for example, roll coating, spin coating, spray coating, slit coating, flow coating, or die coating. After the substrate coated with the film is dried, a mask is placed on the sample, and the film is exposed through the mask and developed. If necessary through optional thermal curing or photocuring, a black matrix is formed.

After coating, drying may be carried out, for example, using a hot plate, IR oven or convection oven. The radiation used to form a layer is selected from visible light, ultraviolet light, far ultraviolet light, electron beams, X-rays and the like. It preferably has a wavelength of 190 to 450 nm. The irradiation energy of the radiation is preferably of from 1 to 1,000 $mJ/cm^2$.

As the alkali developing liquid, an aqueous solution of, e.g., $NaCO_3$ or NaOH, can be used. Also, an organic alkali such as dimethylbenzylamine or triethanolamine can be used. An anti-foaming agent or a surfactant can be added to the developing liquid. An aqueous developing liquid is preferred. Development is carried out by shower, spray, dip, puddle development or the like at normal temperature for 5 to 300 sec.

Preference is given to photosensitive resist formulation which is optionally post-cured at a temperature of 40 to 320° C., more preferably 100 to 300° C. and most preferably 120 to 250° C. Optionally, the post-curing step may be a drying step at a maximum of 20-70° C.

The photosensitive resist formulation may also be applied by ink-jet printing.

Preferably, the black matrix of the invention is formed on the TFT element substrate. The structure can be applied in various systems, for example in a color filter on array technology (COA), in which a color filter including both a black matrix and pixels is formed on a TFT element substrate side, or a black matrix on array technology (BOA) in which only a black matrix is formed on a TFT element substrate side.

The thickness of the dried film of the black matrix is generally ≤0.5 μm, preferably of from 1 to 5 μm.

The present invention also relates to a method for manufacturing a black matrix, which method comprises
a step of coating a curable composition, especially the photosensitive resist formulation as described herein-before, on a substrate to form a curable composition layer,
a step of exposing said layer through a mask to form a crosslinked layer matrix,
a step of developing said exposed layer matrix to form a black matrix, and
a step of dying said layer.

After forming the black matrix, colored inks may be applied patternwise in the depressions between the black matrix by ink-jet printing or photolithography. Each ink ends up in only some of the depressions in accordance with a regular pattern.

The present invention also relates to a method for manufacturing a color filter, which method comprises
forming the black matrix as described above, and
applying patternwise in depressions of the black matrix a red, a green and a blue ink by ink-jet printing or photolithography.

The inventive colorant mixture as defined above can be used for generating a black matrix, for the manufacture of a color filter, regardless of the above-described differences in processing, regardless, of additional layers, which can be applied and regardless of differences in the design of the color filter. The use of the colorant mixture of the invention to form a black element shall not be regarded as limited by different designs and manufacturing processes of such color filters.

Accordingly, the present invention relates to a color filter comprising pixels composed of at least three colors and a black matrix, wherein said black matrix separating the pixels contains the colorant mixture as described in any aspects herein-before or a coating film formed by curing the photosensitive resist formulation, as described herein-before.

The present invention further relates to the use of the color filters described above for a display and/or image sensor application. The display application is preferably a plasma display, organic light emitting diode (OLED) display, inorganic electroluminescent display, field emission display, liquid crystal display (LCD) and e-paper displays. For LCD, various backlight can be used such as neon tubes and light emitting diodes (LED), preferably so-called "white-LED" backlight composed of blue LED chip with yellow a/o green+ red emitting materials. The image sensor application is preferably a charge coupled device or a CMOS sensor.

The present invention also relates to a liquid crystal display device, an organic light emitting diode display device or an e-paper display device containing a color filter as described herein-before.

The present invention also relates to the use of the colorant mixture as described herein-before in manufacturing a black matrix for a color filter, a black column spacer for a liquid crystal display device or a black bezel of a display device.

Yet another embodiment relates to the use of the colorant mixture as described above for a black column spacer in a LCD device. A column spacer according to the present invention is generally prepared from a photosensitive resist formulation using a photolithography process as described, for example herein-before. The resultant black column spacer can improve the contrast ratio of LCD panel. It is preferred to apply the column spacer comprising of the colorant mixture of the present invention onto a TFT array to avoid malfunction of TFT switching by environmental light. It is possible to use the black column spacer as a part of a black matrix. In this case the column spacer and black matrix is possible to produce at once by applying half tone exposure technique to fabricate a rather thin black matrix and a rather thick column spacer. Furthermore, it is possible to completely replace a black matrix by a black column spacer which simplifies the production process to reduce overall LCD production costs.

The size of a column spacer very much differs by end applications. For example, relatively large diameters of 20~30 μm may be used for large size TV application, and relatively small diameters of less than 10 μm may be suitable for high resolution mobile application. The height of the column spacer is in general from 1 to 10 μm, preferably 1 to 5 μm.

Accordingly, the present invention relates to a LCD device comprising a black column spacer, which column spacer contains the colorant mixture as defined in any aspects hereinbefore, preferably a cured coating film of a photosensitive resist formulation.

Another embodiment of the present invention relates to the coloration of a bezel of displays equipped with electric touch sensors. Coloring a bezel can be performed by common coating and printing methods known in the art. The colorant mixture of the present invention is also useful to mass coloration of a film which can then be laminated onto a support to make a black bezel. Advantageously, a black color by display design with a specific tone, e.g. a bluish black or a reddish black, may be adjusted by the mixing ratio of the colorant mixture of the present invention and further by an addition of other colorant(s) (c). The colorant mixture of the present invention is NIR transparent so that IR sensor and/or IR emitter as communications transmitter or touch sensor can be assembled hiding in the bezel.

The present invention also relates to a display device equipped with a touch sensor, wherein a bezel of the device contains the colorant mixture as defined in any aspect hereinbefore.

The black colorant mixture, especially black pigment mixture, provides a stable pigment dispersion resulting in coating films useful for manufacturing black matrices and column spacers.

The black matrix and column spacer described herein show a good overall performance, especially a significantly high blackness. Mixing colorant (a) with a perylene colorant provides a significantly improvement of the optical density a film.

The higher the optical density is the higher definition, contrast ratio and brightness of the resultant LCD devices are.

Due to the low dielectric constant of the photosensitive resist formulation and high volume resistivity, the formulation does not influence driving of liquid crystals when forming a film on a TFT substrate, affected by the reduced amount or lack of carbon black in the colorant mixture.

As the colorants (a) and (b) are both NIR transparent, heat generated from a TFT element can be effectively dissipated, compared to matrices using carbon black. Heat generated by driving a TFT element which is integrated in high density leads to accumulation of heat without sufficient cooling in a device. Such heat generation leads to an increase of in on current and off current of the TFTs resulting in thermal runaway which further encourages heat generation and may cause disadvantages, like less lifetime of the device, thermal deformation of, e.g., the color filter.

The NIR transparent property of the colorant mixture of the present invention can allow using NIR laser for detection of TFT array under black matrix and/or black column spacer that enables quick and precise alignment of, e.g. photo mask of photolithography process and assembly of two glass substrates of LCD, to improve productivity and yield.

The black elements comprising the inventive colorant mixture exhibit the required combination of high optical density, low dielectric constant, high resistivity and high NIR transparency properties.

FIG. 1 describes the absorption spectra of Example 5 and Comparative Example 10 at a pigment content of 25% by weight and a film thickness of 3 μm film (finally cured).

The definitions and preferences given for the colorant mixture mentioned herein-before apply in any combination as well as in any combination for the other aspects of the invention.

The present invention will now be explained in more detail with reference to the following examples. However, the following examples are provided for illustrative purposes only, and the scope of the present invention should not be limited thereto in any manner. Unless otherwise stated, "%" is always % by weight.

EXAMPLES

Synthesis Example A

Cis/trans-isomer or tautomer mixture of formula I ($R^1 \sim R^{10}$=H) is prepared according to Example 1 of WO-A-2010/081624.

Synthesis Example B

Cis/trans-isomer mixture of formula II/III ($R^{15}$=$R^{16}$=1,2-phenylene; n=0) is prepared according to Example 1 of US-A-2007/0151478.

Examples 1 to 9 and Comparative Examples 10 to 31

Preparation of Black Dispersion films

The following substances are introduced into a 37 ml screw bottle:

| | |
|---|---|
| 1.5 g | Colorant(s) |
| 11.0 g | Propylene glycol 1-monomethyl ether 2-acetate (PGMEA) |
| 0.31 g (0.25 g solids) | Dispersant (= EFKA ® 4300; containing 80 wt % solids, commercially available from BASF Japan Ltd.) |
| 11.2 g (4.25 g solids) | 38 wt. % solution of a binder in PGMEA (co-polymer of benzyl methacrylate and methacrylic acid (SPC-2000, Showa Highpolymer Co. Ltd.) |
| 50.0 g | 0.5 mm zircon beads |

Colorants used in the Examples and Comparative Examples:
Example A
Example B
C.I. Pigment Blue 15:4 (PB 15:4; Irgalite® Blue GLVO, BASF Japan Ltd.)
C.I. Pigment Blue 15:6 (Irgaphor® Blue E-CF, BASF Japan Ltd.)
C.I. Pigment Blue 60 (Cromophtal® Blue A3R, BASF Japan Ltd.)
C.I. Pigment Green 36 (Heliogen® Green CF9365, BASF Japan Ltd.)
C.I. Pigment Red 122 (Cromophtal® Jet Magenta DMQ, BASF Japan Ltd.)
C.I. Pigment Red 17 (Cromophtal® Red A2B, BASF Japan Ltd.)
C.I. Pigment Red 254 (Irgaphor® Red B-CF, BASF Japan Ltd.)
C.I. Pigment Violet 23 (Cromophtal® Violet GA, BASF Japan Ltd.)
C.I. Pigment Violet 37 (Cromophtal® Violet B, BASF Japan Ltd.)
C.I. Pigment Black 1 (Paliotol® Black L0080, BASF Japan Ltd.)
C.I. Pigment Black 32 (Paliogen® Black L0086, BASF Japan Ltd.)
C.I. Pigment Yellow 150 (Levascreen® Yellow G, LANXESS)

The bottle is sealed with an inner cup and then applied to a paint conditioner for 5 hours to form a dispersion. After separating the beads by filtration the dispersion is spin coated onto a glass substrate, wherein the layer thickness is adjusted to be 3 μm by controlling the rotation speed. The resulting layer is then dried at 60° C. for 1 hour. The layer thickness of the films is measured by use of a stylus surface profilometer (Dektak® 6M, ULVAC Inc.). The optical properties of the films thus obtained are measured using a spectrophotometer (UV-2500PC, Shimadzu). The color points (x, y, Y values according to C.I.E. 1931 x, y chromaticity diagram) are calculated using standard C light by 2 degree viewing angle. The optical densities of the films are calculated using the Y value by C light thus obtained, i.e. OD=log (100/Y), and the spectrum coverage of the film is estimated by an absorption edge of longer wavelength to give OD=1.5. The results are summarized below:

TABLE 1

Optical properties of black dispersion films

| | Colorant(s) | Ratio of colorants (wt. %) | OD at 3 μm by C light | Absorption edge OD = 1.5 |
|---|---|---|---|---|
| Ex. 1 | Ex. A/Ex. B | 80/20 | 2.46 | 670 nm |
| Ex. 2 | Ex. A/Ex. B | 60/40 | 2.54 | 680 nm |
| Ex. 3 | Ex. A/Ex. B | 50/50 | 2.55 | 685 nm |
| Ex. 4 | Ex. A/Ex. B | 40/60 | 2.58 | 690 nm |
| Ex. 5 | Ex. A/Ex. B | 30/70 | 2.60 | 695 nm |
| Ex. 6 | Ex. A/Ex. B | 20/80 | 2.60 | 700 nm |
| Ex. 7 | Ex. A/Ex. B | 10/90 | 2.58 | 705 nm |
| Ex. 8 | Ex. A/Ex. B/PV23 | 45/45/10 | 2.65 | 670 nm |
| Ex. 9 | Ex. A/Ex. B/PY139 | 40/50/10 | 2.37 | 680 nm |

TABLE 2

Optical properties of black dispersion films

| | Colorant(s) | Ratio of colorants (wt. %) | OD at 3 μm by C light | Absorption edge OD = 1.5 |
|---|---|---|---|---|
| Comp. Ex. 10 | Example A | 100/0 | 2.37 | 660 nm |
| Comp. Ex. 11 | Ex. A/PB15:4 | 80/20 | 2.22 | 690 nm |
| Comp. Ex. 12 | Ex. A/PB15:4 | 60/40 | 1.92 | 740 nm |
| Comp. Ex. 13 | Ex. A/PB15:6 | 80/20 | 2.31 | 680 nm |
| Comp. Ex. 14 | Ex. A/PB15:6 | 60/40 | 2.06 | 700 nm |
| Comp. Ex. 15 | Ex. A/PB60 | 80/20 | 2.33 | 680 nm |
| Comp. Ex. 16 | Ex. A/PB60 | 60/40 | 2.17 | 695 nm |
| Comp. Ex. 17 | Ex. A/PG36 | 80/20 | 2.17 | 675 nm |
| Comp. Ex. 18 | Ex. A/PG36 | 60/40 | 1.72 | 685 nm |
| Comp. Ex. 19 | Ex. A/PR122 | 80/20 | 2.02 | 640 nm |
| Comp. Ex. 20 | Ex. A/PR122 | 60/40 | 1.70 | 590 nm |
| Comp. Ex. 21 | Ex. A/PR177 | 80/20 | 2.10 | 640 nm |
| Comp. Ex. 22 | Ex. A/PR177 | 60/40 | 1.86 | 600 nm |
| Comp. Ex. 23 | Ex. A/PV23 | 80/20 | 2.43 | 655 nm |
| Comp. Ex. 24 | Ex. A/PV23 | 60/40 | 2.43 | 650 nm |
| Comp. Ex. 25 | Ex. A/PV37 | 80/20 | 2.46 | 655 nm |
| Comp. Ex. 26 | Ex. A/PV37 | 60/40 | 2.29 | 650 nm |
| Comp. Ex. 27 | Ex. A/PBk1 | 80/20 | 2.10 | 655 nm |
| Comp. Ex. 28 | Ex. A/PBk1 | 60/40 | 1.81 | 645 nm |
| Comp. Ex. 29 | Ex. A/PBk32 | 80/20 | 2.08 | 665 nm |
| Comp. Ex. 30 | Ex. A/PBk32 | 60/40 | 1.87 | 690 nm |
| Comp. Ex. 31 | PY150/PR254/ PV23/PG36/ PB15:6 * | 18/32/7/18/ 25 | 2.35 | 770 nm |

* According to the pigment combination of dispersion 1 of US-A-2010/0243970

The results mentioned in Tables 1 and 2 indicate a significant improvement of a combination of Example A and Example B, optionally with additional colorant(s), compared to the colorant of Example A. The values of both a higher OD and a wider spectrum coverage lead to a superior blackness of the film (the higher the OD and the longer the wavelength of the absorption edge, the better the blackness).

FIG. 1 shows absorption spectra of Example 5 and Comparative Example 10 at a pigment content of 25 wt. % and a film thickness of 3 μm (finally dried). Example 5 has higher absorption in visible region, especially in the most eye-sensitive green region around 500~550 nm contributing to higher optical density, and wider spectrum coverage in deep red region contributing to more neutral black color with very high transmission in near IR region which enables better heat release from bottom layers and quick and precise alignment of, e.g. photo mask of photolithography process and assembly of two substrates of LCD to improve productivity and yield.

Examples 32 and 33

Example 1 is repeated except that 1.35 g of colorant(s) and 0.15 g of a pigment derivative are used instead of 1.5 g of colorant(s).

Pigment derivatives used in the Examples:
D-1: Quinacridone derivative of Example 1 of EP-A-0485337
D-2: Quinophthalone derivative of Example 1 of US-A-2003/0172847

The rheology of the dispersions is measured using a rheometer (DV III+Rheometer, Brookfield) with a spindle CP-42 a/o CP-52 at a rotation speed of 6 rpm at 25° C. The dispersions are kept at 40° C. for 7 days to evaluate storage stability. The results are summarized below.

TABLE 3

Rheology of black dispersions

| | Colorant(s) | Pigment derivative | Viscosity (mPa · s) initial/ after 7 days at 40° C. |
|---|---|---|---|
| Ex. 3 | Ex. A/Ex. B (50/50) | none | 52/161 |
| Ex. 32 | Ex. A/Ex. B (50/50) | D-1 | 32/43 |
| Ex. 33 | Ex. A/Ex. B (50/50) | D-2 | 49/67 |

Although the target rheology is varied by applications, the addition of pigment derivatives improves the stability of viscosity of the black dispersions of the present invention.

Examples 34 to 36

Preparation of Black Photosensitive Resists

The following substances are introduced into a 37 ml screw bottle:

| 1.50 g | Example A |
| 1.50 g | Example B |
| 6.81 g | PGMEA |
| 0.63 g | Dispersant (EFKA ® 4300) |
| 1.32 g | 38 wt. % solution of a binder (SPC-2000) |
| 30.0 g | 0.5 mm zircon beads |

The bottle is sealed with an inner cup and then applied to a paint conditioner for 3 hours to form a dispersion. Then, the following substances are added and applied to the paint conditioner for 15 minutes.

| 7.09 g | PGMEA |
| 2.00 g | 38 wt. % solution of a binder (SPC-2000) |
| 1.25 g | Dipentaerythritol penta-/hexa acrylate (DPHA) (Sigma-Aldrich) |

From now on all operations are carried out under yellow light. 0.3 g of a photoinitiator is added to the formulation to give a photosensitive resist formulation.
Photoinitiators used in the Examples:
Irgacure® 369 (BASF Japan Ltd.)
Irgacure® OXE01 (BASF Japan Ltd.)
Irgacure® OXE02 (BASF Japan Ltd.)

The resist formulation thus prepared is spin coated onto a glass substrate, wherein the layer thickness is adjusted to be 1 μm by controlling the rotation speed. The resulting layer is then dried at 80° C. for 10 minutes. A negative tone test pattern (1951 USAF test target, Edmund Optics) is placed directly on the resist film. Exposure is carried out using a 250 W super high pressure mercury lamp (USH-250BY, USHIO) at a distance of 15 cm. A total exposure dose on the glass filter is adjusted to be 150 mJ/cm² by using an optical power meter (Model UV-MO2 with UV-35 detector, ORC UV Light Measure). After exposure, the exposed film is developed with an alkaline solution (5% aqueous solution of DL-A10, YOKOHAMA OILS & FATS) for 10 seconds after break time, i.e. the development time of un-exposed region, at 23° C. by using a spray type developer (AD-1200, MIKASA). 12 μm fine patterns can be obtained from all resist compositions.

Next, a resist film of 3 μm thickness is prepared and a step-wedge pattern mask with 9 linear steps and 9 logarithmic steps of different optical density (EIA gray scale pattern slide, Edmund Optics) is placed directly on the film. Exposure is carried out in the same manner except the exposure dose is adjusted to be 500 mJ/cm². After exposure, the exposed film is developed with the alkaline solution for 10 seconds after break time at 28° C. using the spray type developer. The necessary UV dose for full curing (i.e. the pattern is not dissolved with the alkaline solution) is calculated from the residual thickness of each step after development. The smaller the dose value, the higher the sensitivity of the resist formulation. The results are summarized below:

TABLE 4

Photosensitivity of the black resists

| | Photoinitiator | Necessary UV dose for full curing |
|---|---|---|
| Example 36 | Irgacure 369 | 99 mJ/cm² |
| Example 37 | Irgacure OXE01 | 73 mJ/cm² |
| Example 38 | Irgacure OXE02 | 23 mJ/cm² |

As above mentioned, the colorant composition of the present invention is suitable to manufacture a black fine pattern under pragmatic photolithography condition.

The invention claimed is:
1. A colorant mixture comprising
(a) a bis-oxodihydro-indolylene-benzodifuranone colorant of formula

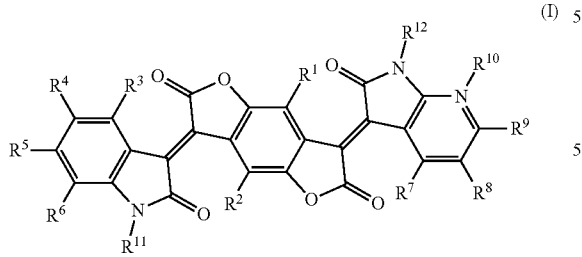

(I)

or an isomer or tautomer or a mixture thereof, wherein
$R^1$ and $R^2$ are independently of each other H, $CH_3$, $CF_3$, F or Cl;
$R^3$ and $R^7$ are independently of each other H, F, Cl, $R^{13}$ or $OR^{13}$;
$R^4$, $R^5$, $R^6$, $R^8$, $R^9$ and $R^{10}$ are independently of each other H, F, Cl, Br, COOH, $COOR^{13}$, $CONH_2$, $CONHR^{13}$, $CONR^{13}R^{14}$, CN, $COR^{13}$, $SO_3H$, $SO_2NH_2$, $SO_2NHR^{13}$, $SO_2NR^{13}R^{14}$, $SO_2R^{13}$, $NO_2$,
$R^{13}$, $OR^{13}$, $SR^{13}$, $NR^{13}R^{14}$, $NHCOR^{13}$ or

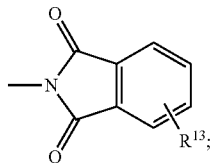

or
$R^3$ and $R^4$, $R^4$ and $R^5$, $R^5$ and $R^6$, $R^7$ and $R^8$, $R^8$ and $R^9$, and/or $R^9$ and $R^{10}$ together form a $C_1$-$C_6$-alkylenedioxy, $C_3$-$C_6$-alkylene, $C_3$-$C_6$-alkenylene or 1,4-butadienylene radical, each of which is unsubstituted, mono- or polysubstituted by F, $OR^{13}$, $NO_2$, oxo, thioxo or $SO_3H$;
$R^{11}$ and $R^{12}$ are independently from each other H;
$C_1$-$C_{18}$-alkyl, $C_3$-$C_{18}$-cycloalkyl, $C_3$-$C_{18}$-alkenyl, $C_3$-$C_{18}$-cycloalkenyl, $C_3$-$C_{18}$-alkynyl or $C_2$-$C_{12}$-heterocycloalkyl, each of which is unsubstituted, mono- or polysubstituted by F, oxo or thioxo and uninterrupted or interrupted one or more times by O, S or $NR^{13}$; or
is $C_7$-$C_{18}$-aralkyl, $C_1$-$C_{12}$-heteroaryl-$C_1$-$C_8$-alkyl, $C_6$-$C_{18}$-aryl or $C_1$-$C_{12}$-heteroaryl, each of which is unsubstituted, mono- or polysubstituted by oxo, thioxo, F, Cl, Br, COOH, $COOR^{13}$, $CONH_2$, $CONHR^{13}$, $CONR^{13}R^{14}$, CN, $COR^{13}$, $SO_3H$, $SO_2NH_2$, $SO_2NHR^{13}$, $SO_2NR^{13}R^{14}$, $SO_2R^{13}$, $NO_2$,
$R^{13}$, $OR^{13}$, $SR^{13}$, $NR^{13}R^{14}$, $NHCOR^{13}$ or

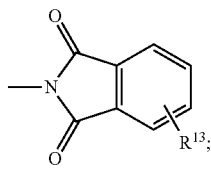

$R^{13}$ and $R^{14}$ are independently of each other $C_1$-$C_{18}$-alkyl, $C_3$-$C_{18}$-cycloalkyl, $C_3$-$C_{18}$-alkenyl, $C_3$-$C_{18}$-cycloalkenyl, $C_3$-$C_{18}$-alkynyl or $C_2$-$C_{12}$-heterocycloalkyl, each of which is unsubstituted, mono- or polysubstituted by F, oxo, thioxo, $OR^{15}$, $SR^{15}$ or $NR^{15}R^{16}$; or
is $C_7$-$C_{18}$-aralkyl, $C_1$-$C_{12}$-heteroaryl-$C_1$-$C_8$-alkyl, $C_6$-$C_{18}$aryl or $C_1$-$C_{12}$-heteroaryl, each of which is unsubstituted, mono—or polysubstituted by oxo, F, Cl, Br, COOH, $CONH_2$, $CONHR^{15}$, $CONR^{15}R^{16}$, $SO_3H$, $SO_2NH_2$, $SO_2NHR^{15}$, $SO_2NR^{15}R^{16}$, $SO_2R^{15}$, CN, $NO_2$, $OR^{15}$, $SR^{15}$, $NR^{15}R^{16}$, $NHCOR^{15}$ or

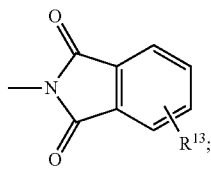

or two vicinal radicals of $R^{13}$ and/or $R^{14}$ together form
—O—CO—O—, —O—CS—O—, —CO—NCO—,
—N—CO—N—, —N═S═N—, —N—C═C—,
—O—C═C—, —S—C═C—, —O—C═N—,
—S—C═N—, —N—N═N—, —N═C—C═C—, —C=N—C=C—, —N=C—C=N—, —C=N—N=C—, —C=N—C=N— or —C=C—C=C—, in which —C= and —N— are independently of each other substituted by H or $R^{15}$;

or two geminal or vicinal radicals of $R^{13}$ and/or $R^{14}$ together form a $C_3$-$C_8$-alkylene or $C_3$-$C_8$-alkenylene radical, each of which is unsubstituted, mono- or polysubstituted by F, oxo or thioxo, and in which 0, 1 or 2 non-vicinal methylene units are be replaced by O, S or $NR^{15}$;

$R^{15}$ and $R^{16}$ are independently of each other $C_1$-$C_8$-alkyl, $C_3$-$C_6$-cycloalkyl or benzyl, each of which is unsubstituted, mono- or polysubstituted by oxo, thioxo, F or $C_1$-$C_8$-alkoxy; or is phenyl or $C_1$-$C_5$-heteroaryl, each of which is unsubstituted, mono or polysubstituted by F, Cl, Br, CO-$C_1$-$C_8$-alkyl, COOH, $CONH_2$, $CONHC_1$-$C_8$-alkyl, $CON(C_1$-$C_8$-alkyl$)_2$, $SO_3H$, $SO_2NH_2$, $SO_2NHC_1$-$C_8$-alkyl, $SO_2N(C_1$-$C_8$-alkyl$)_2$, CN, $NO_2$, $C_1$-$C_8$-alkyl, $C_1$-$C_8$-alkoxy, $C_1$-$C_8$-thioalkoxy or $N(C_1$-$C_8$-alkyl$)_2$;

or two vicinal radicals of $R^{15}$ and/or $R^{16}$ together form —O—CO—O—, —O—CS—O—, —CO—N—CO—, —N—CO—N—, N=S=N—, —N—C=C—, —O—C=C—, —S—C=C—, —O—C=N—, —S—C=N—, —N—N=N—, —N=C—C=N—, —C=N—C=C—, —N=C—C=N—, —C=N—N=C—, —C=N—C=N— or —C=C—C=C—, in which —C= and —N— are independently of each other substituted by H, F, $C_1$-$C_8$-alkyl or $C_1$-$C_8$-alkoxy;

or two geminal or vicinal radicals of $R^{15}$ and/or $R^{16}$ together form a $C_3$-$C_8$-alkylene or $C_3$-$C_8$-alkenylene radical, each of which is unsubstituted, mono- or polysubstituted by oxo or thioxo, and in which 0, 1 or 2 non-vicinal methylene units are replaced by O, S or $N(C_1$-$C_8$-alkyl); and (b) a perylene colorant of formula

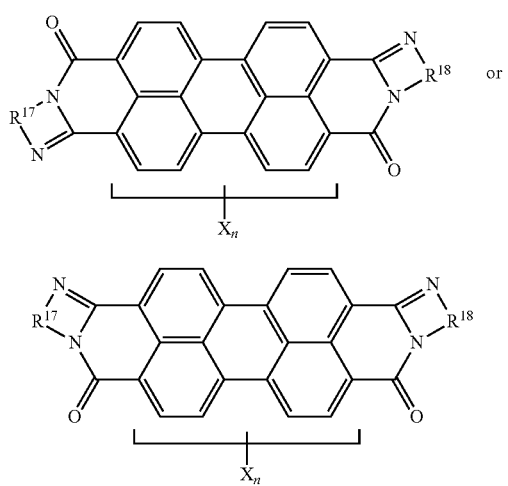

or a mixture thereof, wherein $R^{17}$ and $R^{18}$ are independently of each other phenylene, naphthylene or pyridylene, each of which is unsubstituted, mono- or polysubstituted by $C_1$-$C_{18}$alkyl, $C_1$-$C_{18}$alkoxy, OH, $NO_2$, F, Cl, or Br;

X is F, Cl, or Br; and n is 0, 1, 2, 3 or 4.

2. The colorant mixture according to claim 1, wherein in the (a) bis-oxodihydro-indolylene-benzodifuranone colorant of formula (I), $R^1$, $R^2$, $R^3$, and $R^7$ are H;

$R^4$ and $R^8$ are independently of each other H, F, Cl, Br, COOH, CN, $SO_3H$, $NO_2$, $R^{13}$, $OR^{13}$, $NR^{13}R^{14}$, $NHCOR^{13}$;

$R^5$ and $R^9$ are independently of each other H, $NO_2$, CN, COOH or $SO_3H$;

$R^6$ and $R^{10}$ are independently of each other H, F, Cl, $R^{13}$, $OR^{13}$; or $R^5$ and $R^6$, and/or $R^9$ and $R^{10}$ together form a 1,4-butadienylene radical;

$R^{11}$ and $R^{12}$ are H; and $R^{13}$ and $R^{14}$ are independently of each other $C_1$-$C_{12}$-alkyl, each of which is unsubstituted, mono- or polysubstituted by F; or two geminal radicals of $R^{13}$ and $R^{14}$ together form a $C_5$-$C_7$-alkylene radical, each of which is unsubstituted, mono- or polysubstituted by F; and (b) the perylene colorant is a pigment of formula (II) or (III) or a mixture thereof, wherein $R^{17}$ and $R^{18}$ are independently of each other phenylene or naphthylene, each of which is unsubstituted, mono- or polysubstituted by $C_1$-$C_4$-alkyl, $C_1$-$C_4$-alkoxy, OH, $NO_2$, Cl or Br;

and n is 0.

3. A color filter comprising pixels composed of at least three colors and a black matrix, wherein said black matrix separating the pixels contains the colorant mixture of claim 2.

4. A liquid crystal display device, an organic light emitting diode display device or an e-paper display device containing the color filter of claim 3.

5. A liquid crystal display device comprising a black column spacer, which column spacer contains the colorant mixture of claim 2.

6. The colorant mixture according to claim 1, wherein (a) the bis-oxodihydro-indolylene-benzodifuranone colorant is a pigment of formula

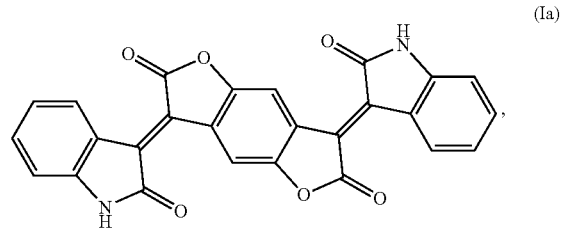 [SMILES: O=C1Nc2ccccc2/C1=C1\C(=O)Oc2cc3c(cc21)OC(=O)/C3=C1/C(=O)Nc2ccccc21]

and in (b) the perylene colorant is a pigment of foimula (II) or (III) or a mixture thereof, $R^{17}$ and $R^{18}$ are the same and are each unsubstituted phenylene or naphthylene; and n is 0.

7. The colorant mixture according to claim 1, wherein the ratio of colorant (a) to colorant (b) is of from 80:20 to 10:90 by weight.

8. The colorant mixture according to claim 1, wherein (c) at least one further colorant is present in an amount of ≤50% by weight, based on the total weight of the colorant mixture (a) and (b), with the proviso that the amount for carbon black as a colorant is ≤30% by weight.

9. The colorant mixture according to claim 1, wherein
(d) a polymeric dispersant is present in an amount of ≤40% by weight, and
(e) a pigment derivative is present in an amount of ≤25% by weight, based on the total weight of the colorants (a), (b) and (c), if present.

10. A composition comprising
(A) the colorant mixture as defined in claim 1, and
(B) a high molecular weight organic material.

11. A photosensitive resist formulation comprising the composition according to claim 10 and further comprising
(B) a binder,
(C) an ethylenically unsaturated monomer, and
(D) optionally a photoinitiator.

12. A coating film formed by curing the photosensitive resist formulation as defined in claim 11, which film is a black matrix for a color filter or a black column spacer in a liquid crystal display device.

13. A color filter comprising pixels composed of at least three colors and a black matrix, wherein said black matrix separating the pixels contains the coating film of claim 12.

14. A liquid crystal display device, an organic light emitting diode display device or an e-paper display device containing the color filter of claim 13.

15. A liquid crystal display device comprising a black column spacer, which column spacer contains the coating film of claim 12.

16. The photosensitive resist formulation according to claim 11, wherein the binder is an alkali soluble resin.

17. A coating film formed by curing the photosensitive resist formulation as defined in claim 16, which film is a black matrix for a color filter or a black column spacer in a liquid crystal display device.

18. A display device equipped with a touch sensor, wherein a bezel of the device contains the colorant mixture of claim 1.

* * * * *